US011126550B1

(12) United States Patent
Yeung et al.

(10) Patent No.: US 11,126,550 B1
(45) Date of Patent: Sep. 21, 2021

(54) INTEGRATING A RESISTIVE MEMORY SYSTEM INTO A MULTICORE CPU DIE TO ACHIEVE MASSIVE MEMORY PARALLELISM

(71) Applicants: University of Maryland at College Park, College Park, MD (US); Crossbar, Inc., Santa Clara, CA (US)

(72) Inventors: Donald Yeung, Bethesda, MD (US); Bruce L. Jacob, Annapolis, MD (US); Mehdi Asnaashari, Danville, CA (US); Sylvain Dubois, San Francisco, CA (US)

(73) Assignee: Crossbar, Inc, Santa Clara, CA (US)

( * ) Notice: Subject to any disclaimer, the term of this patent is extended or adjusted under 35 U.S.C. 154(b) by 118 days.

(21) Appl. No.: 16/121,339

(22) Filed: Sep. 4, 2018

Related U.S. Application Data

(60) Provisional application No. 62/553,679, filed on Sep. 1, 2017.

(51) Int. Cl.
*G11C 11/00* (2006.01)
*G06F 12/0802* (2016.01)
*G11C 13/00* (2006.01)
*H01L 27/24* (2006.01)

(52) U.S. Cl.
CPC ........ *G06F 12/0802* (2013.01); *G11C 13/003* (2013.01); *H01L 27/2463* (2013.01); *G06F 2212/1021* (2013.01)

(58) Field of Classification Search
CPC ............... G06F 12/0802; G11C 13/003; H01L 27/2463
See application file for complete search history.

(56) References Cited

U.S. PATENT DOCUMENTS

| 10,333,508 | B2 | 6/2019 | Barowski et al. |
| 2008/0025132 | A1 | 1/2008 | Fasoli et al. |
| 2008/0025134 | A1 | 1/2008 | Scheuerlein et al. |
| 2012/0303871 | A1* | 11/2012 | Tokiwa .................. G11C 29/44 711/103 |

(Continued)

FOREIGN PATENT DOCUMENTS

| WO | 2013095404 A1 | 6/2013 |
| WO | 2017074583 A1 | 5/2017 |

*Primary Examiner* — Uyen Smet
(74) *Attorney, Agent, or Firm* — Wegman Hessler

(57) ABSTRACT

Disclosed is a monolithic integrated circuit (IC) computing device with multiple independent process cores (multicore) and embedded, non-volatile resistive memory serving as system memory. The resistive system memory is fabricated above the substrate, and logic circuits embodying the process cores are fabricated on the substrate. In addition, access circuitry for operating on the resistive system memory, and circuitry embodying memory controllers, routing devices and other logic components is provided at least in part on the substrate. Large main memory capacities of tens or hundreds of gigabytes (GB) are provided and operable with many process cores, all on a single die. This monolithic integration provides close physical proximity between the process cores and main memory, facilitating significant memory parallelism, reduced power consumption, and eliminating off-chip main memory access requests.

20 Claims, 15 Drawing Sheets

(56) References Cited

U.S. PATENT DOCUMENTS

| | | | |
|---|---|---|---|
| 2013/0003438 A1* | 1/2013 | Merkel | G11C 13/0061 365/148 |
| 2014/0040532 A1* | 2/2014 | Watanabe | G06F 13/4234 711/103 |
| 2016/0253212 A1* | 9/2016 | Solihin | G06F 9/4881 718/104 |
| 2016/0378607 A1 | 12/2016 | Kumar et al. | |
| 2017/0249250 A1 | 8/2017 | Ramanujan et al. | |
| 2018/0028548 A1 | 2/2018 | Shareef et al. | |
| 2018/0095930 A1 | 4/2018 | Lu et al. | |
| 2018/0329815 A1* | 11/2018 | Song | G06F 12/0246 |

\* cited by examiner

EXAMPLE NETWORK-ON-CHIP MONOLITHIC COMPUTING SYSTEM
900

64-cores; 16K-way Memory Parallelism; ~700ns latency; 8-byte blocks

INTEGRATING A RESISTIVE MEMORY SYSTEM INTO A MULTICORE CPU DIE TO ACHIEVE MASSIVE MEMORY PARALLELISM

CROSS-REFERENCE TO RELATED APPLICATIONS

This application claims the benefit of and priority to U.S. Provisional Patent Application Ser. No. 62/553,679 filed Sep. 1, 2017 and entitled "INTEGRATING A ReRAM-BASED MEMORY SYSTEM INTO A MULTICORE CPU's DIE TO ACHIEVE MASSIVE MEMORY PARALLELISM", the entirety of which is hereby incorporated herein by reference and for all purposes.

GOVERNMENT LICENSE RIGHTS

This invention was made with government support under contract number FA807514D0002 awarded by the United States Air Force. The government has certain rights in the invention.

TECHNICAL FIELD

This disclosure relates generally to an integrated circuit containing a network-on-chip computing system, e.g., a multicore chip having large capacity embedded resistive system memory and very high parallelism between process cores and embedded system memory.

BACKGROUND

Resistive memory represents a recent innovation within the field of integrated circuit technology. While much of resistive memory technology is in the development stage, various technological concepts have been demonstrated by the inventor(s) and are in one or more stages of verification to prove or disprove associated theories or techniques. Resistive memory technology is expected to hold substantial advantages over competing technologies in the semiconductor electronics industry.

Resistive memory cells can be configured to have multiple states with distinct resistance values. For instance, for a single bit cell, the resistive memory cell can be configured to exist in a relatively low resistance state or, alternatively, in a relatively high resistance state. Multi-bit cells might have additional states with resistance values that are distinct from one another and from the relatively low resistance state and the relatively high resistance state. The states of the resistive memory cell represent discrete logical information states, facilitating digital memory operations. When combined into arrays of many such memory cells, larger capacities of digital memory storage become feasible.

Resistive memory also shows significant promise in its capacity to scale to more advanced (e.g., smaller) technology nodes. Fabricated in part from thin films and having fairly simple geometries relative to some integrated circuit devices, individual resistive memory cells can operate reliably at very small lithographic feature sizes. As feature sizes continue to decrease, power efficiency as well as density of resistive memory improves further, enabling improved performance and improved flexibility of the technology.

In light of the above, practical developments utilizing resistive memory technology continue.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides a monolithic integrated circuit (IC) computing device with multiple independent process cores (multicore) and embedded, non-volatile resistive memory serving as system memory, or random access memory (RAM). The resistive system memory is fabricated above the substrate, and logic circuits embodying the process cores are fabricated on the substrate. In addition, access circuitry for operating on the resistive system memory, and circuitry embodying memory controllers, routing devices and other logic components is provided at least in part on the substrate. Because resistive memory is very small and has high scalability to advanced process nodes, large main memory capacities (e.g., hundreds of gigabytes (GB) or more) can be implemented with many process cores, all on a single die. This monolithic integration provides close physical proximity between the process cores and main memory, facilitating significant parallelism there between. Additional embodiments sub-divide the large main memory arrays into many sub-arrays, that are each independently accessible. Coupled with many embedded process cores, each operable to access any of the independent sub-arrays, massive parallelism between process cores and resistive system memory is achieved, enabling extremely high performance, in addition to lower power consumption. Various embodiments of the foregoing, including alternative or additional characteristics and features, are provided herein.

In further embodiments, the present disclosure provides an integrated circuit device. The integrated circuit device can comprise a plurality of process cores formed on a substrate of the integrated circuit device, and a resistive memory array structure formed above the substrate of the integrated circuit device and at least in part overlying the plurality of process cores. The resistive memory array structure can comprise multiple resistive memory sub-arrays, each resistive memory sub-array comprising non-volatile, two-terminal resistive switching memory cells. In addition, the integrated circuit can comprise access circuitry formed at least in part on the substrate of the integrated circuit device that provides independent operational access to respective resistive memory sub-arrays of the multiple resistive memory sub-arrays. In an embodiment, the access circuitry can be integrated among logic circuitry embodying the process cores formed on the substrate of the integrated circuit device. The access circuitry can be integrated among the process cores in a fine-grain cohesive manner, in an embodiment. Still further, the integrated circuit can comprise a plurality of memory controllers including a first group of memory controllers communicatively coupled with a first process core of the plurality of process cores and operable to receive a first memory instruction from the first process core and execute the first memory instruction on a first plurality of the multiple resistive memory sub-arrays in response to the first memory instruction, and a second group of memory controllers communicatively coupled with a second process core of the plurality of process cores and operable to receive a second memory instruction from the second process core and execute the memory instruction on a second plurality of the multiple resistive memory sub-arrays in response to the second memory instruction. In one or more embodiments, the first memory instruction or the second memory instruction is a memory read that returns less than 128 bytes of data.

Additional embodiments of the present disclosure provide a method of fabricating an integrated circuit device. The method can comprise providing logic circuitry embodying a plurality of process cores and cache memory for the process cores on a substrate of a chip, and providing access circuitry for independent sub-arrays of resistive system memory at least in part on the substrate of the chip. Additionally, the method can comprise providing circuitry embodying multiple memory controllers per process core of the plurality of process cores at least in part on the substrate of the chip. According to various embodiments, the method can also comprise forming non-volatile, two-terminal resistive memory devices embodying the independent sub-arrays of resistive system memory overlying the substrate and overlying at least a portion of the logic circuitry, the access circuitry or the circuitry embodying the multiple memory controllers. Still further, the method can comprise forming electrical connections between respective portions of the access circuitry on the substrate of the chip and each independent sub-array of the resistive system memory overlying the substrate of the chip, and forming electrical connections between circuitry embodying each memory controller and respective portions of the access circuitry. The method can also comprise providing communication pathways between the logic circuitry embodying the plurality of process cores and the circuitry embodying the multiple memory controllers, and configuring a memory controller of the multiple memory controllers to implement a memory instruction on an associated independent sub-array of the resistive system memory in response to a main memory request originating at the cache memory of the logic circuitry.

In further embodiments of the present disclosure, provided is an integrated circuit device. The integrated circuit device can comprise a plurality of processor tiles, in which a processor tile includes a process core, cache memory and a cache controller, a memory controller and a multi-data memory instruction set, wherein the plurality of process tiles are formed on a substrate of the integrated circuit device. The integrated circuit device can further comprise a resistive memory array structure formed above the substrate of the integrated circuit device, the resistive memory array structure comprising multiple independently addressable sub-arrays formed of non-volatile, two-terminal resistive switching memory, wherein a portion of the independently addressable sub-arrays is managed by the memory controller. Additionally, the integrated circuit device can comprise access circuitry formed at least in part on the substrate of the integrated circuit device that interconnects the memory controller with the portion of the independently addressable sub-arrays managed by the memory controller. In various embodiments, the integrated circuit device can also comprise a command and data bus interconnecting respective processor tiles of the plurality of processor tiles, wherein the resistive memory array structure serves as system memory for the process core of the processor tile.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
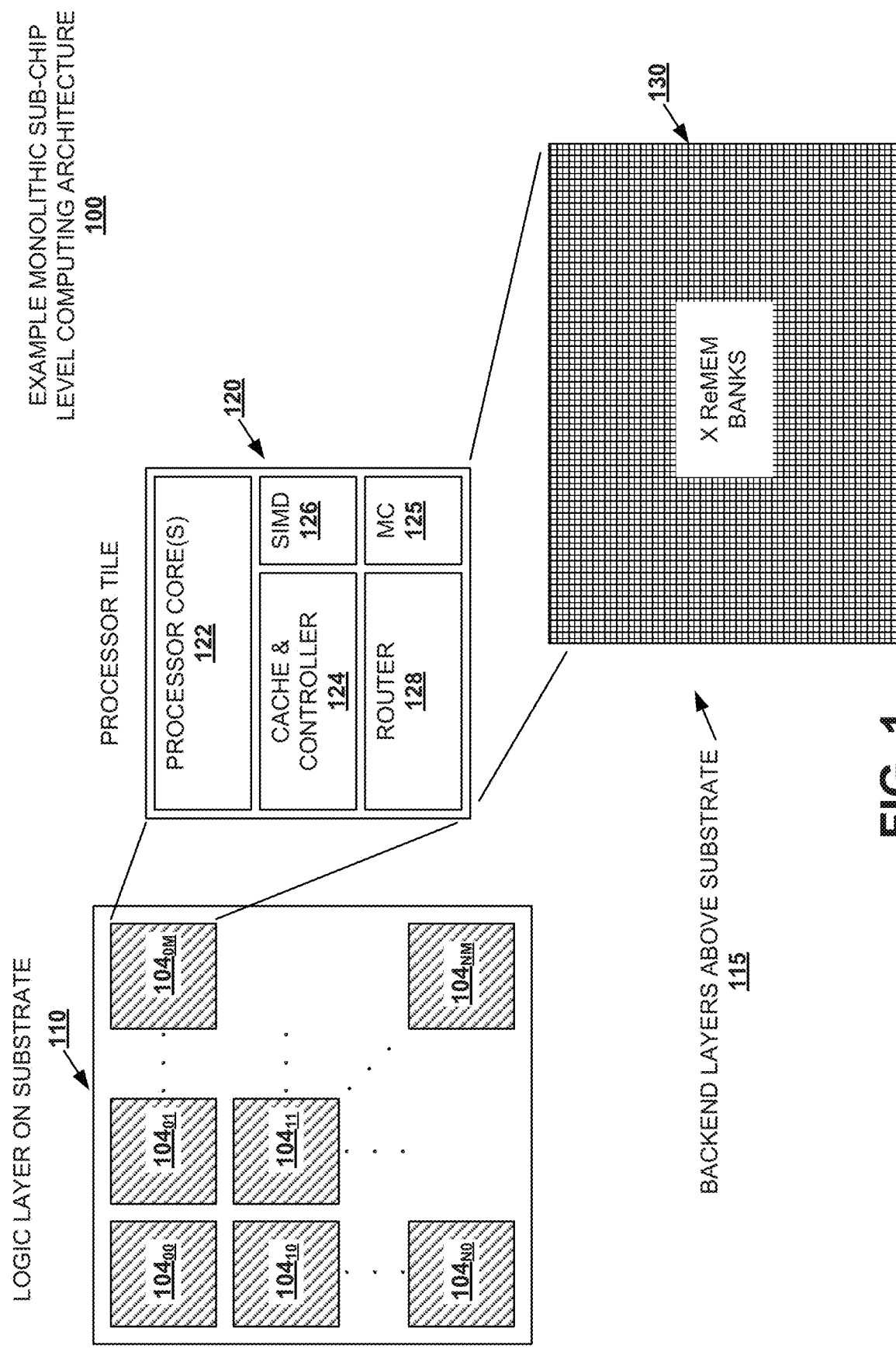
FIG. 1 depicts a block diagram of an example monolithic sub-chip level computing architecture for an integrated circuit (IC) chip in embodiments of the disclosure.

This disclosure relates to a monolithic integrated circuit (IC) device having multiple process cores and embedded, non-volatile resistive memory serving as main memory (or random access memory (RAM)) for the multiple process cores. Use of non-volatile main memory facilitates applications in which continuous external power is not necessary, because threat of data loss is avoided or greatly mitigated. Further, highly scalable resistive-switching two-terminal memory cells (also referred to as resistive-switching memory cells, resistive memory cells or resistive memory) can provide very high system memory capacities, such as tens or hundreds of gigabits (Gb) or more, far beyond the capability of embedded dynamic random access memory (DRAM). To achieve data throughputs between process cores and system memory that approaches or exceeds that of modern DRAM memories, high parallelism between process cores and embedded resistive system memory is provided. The high parallelism can be achieved by multiple mechanisms, including large numbers of process cores, very large numbers of independently operable resistive memory sub-arrays, embedded memory controllers serving each process core, as well as multithreading, multi-data, and non-blocking multi-data memory instruction sets, among others. In at least some example embodiments, although the disclosure is in no way limited to this example, provided is a 20 mm×20 mm IC chip based on a 16 nanometer (nm) process technology having at least 64 process cores, more than 32 GB of non-volatile system memory in a single two dimensional (2D) crossbar array, arranged in more than 8 thousand independently operable memory sub-arrays, of 2048×2048 cells each. Stacking two of these 2D crossbar arrays achieves 64 GB of non-volatile system memory, in this embodiment, and more than 16 thousand independent sub-arrays. Similarly, stacking 8 2D crossbar arrays achieves 256 GB of non-volatile system memory, and more than 64 thousand independent sub-arrays. Further, utilizing extremely high wiring density available through very large scale integration (VLSI) semiconductor fabrication techniques, high data throughput between the multiple cores and the system memory can be achieved, supporting thousands or tens of thousands of concurrent memory requests. Other examples within the scope of the present disclosure include other process technologies (e.g., 14 nm process technology, 12 nm process technology, 7 nm process technology, etc.) facilitating even greater memory capacities, numbers of individually accessible sub-arrays, cells per sub-array, or the like, or combinations thereof. Still further, additional or alternative characteristics of a monolithic memory chip having multi-core processors and embedded resistive memory known in the art or made known to one of ordinary skill in the art by way of the context provided herein, are considered within the scope of the present disclosure.

As utilized herein, the term process core refers to any suitable analog or digital instruction and data execution device capable of being embodied within an integrated circuit chip. Suitable examples of a process core include general purpose devices, such as a central processing unit (CPU). Other suitable examples include special purpose devices, such as accelerators and the like. Examples include a graphics processing unit (GPU), digital signal processor (DSP), physics processing unit (PPU), application-specific instruction set processor (ASH)), network processor, image processor, and so forth. Other examples known in the art or made known to one of ordinary skill in the art by way of the context provided herein, are considered within the scope of the present disclosure.

In one or more additional embodiments, sub-page sized access capabilities of two-terminal resistive switching memory sub-arrays can be leveraged by multi-core processor tiles of disclosed monolithic IC computing chips. With other memory technologies such as DRAM or FLASH memory, the minimum memory that can be accessed per memory request is a page (e.g., a full row of an array or sub-array) of data. Where only a portion of data saved to the page is required for the memory request, extraneous data will be returned, reducing useful data throughput. As utilized herein, the term "useful data throughput" refers to a ratio of required or targeted data transferred between main memory and a set of process cores, compared to the total data transferred (including extraneous data). By enabling sub-page sized memory access requests, much more granular data access can be achieved. For instance, fetch sizes can be similar or equal to the size of useful data in some cases (e.g., 1 byte, 2 bytes, 4 bytes, etc.), or only moderately larger. This results in a much higher degree of useful data throughput between process cores and system memory. As a result, disclosed embodiments can minimize or avoid data redundancy, further reducing power consumption, and maximizing useful data throughput.

In various embodiments disclosed herein, variable access granularity can be implemented. In such embodiments, disclosed process cores (or cache controllers) can specify non-fixed data fetch sizes. Conventional memory is limited to fetching large contiguous blocks of data on each main memory access (e.g., 128-bytes for many DRAM main memory systems). This can be efficient for programs that exhibit good spatial reuse, facilitating high memory bandwidth. However, for programs with lower spatial reuse, fetching large data blocks results in low useful data throughput, as much of the data returned for each memory request is ignored or wasted. Resistive memory can support many fetch sizes, and can support variable fetch sizes that change per memory request. As a result, disclosed computing architectures incorporate dynamic fetch size requests to resistive main memory, which can be dynamically configured to match spatial reuse of target memory observed at runtime.

According to one or more additional embodiments, disclosed monolithic computing chips can be fabricated in part or in whole utilizing complementary metal oxide semiconductor (CMOS) fabrication processes. This enables process logic circuitry, cache and cache controller circuitry, routing device circuitry, memory controller circuitry, as well as high capacity embedded resistive memory arrays to be fabricated with a sequence of CMOS logic processing steps to form a complete computing architecture on a single IC chip. This includes, in one or more embodiments, multiple process cores, command and data routing devices as well as an integrative command and data pathway between the process cores and routing devices, resulting in a network-on-chip architecture comprising very high capacity resistive system memories. This results in a significant advancement over the state of the art in system on chip devices.

Multiple resistive memory technologies having characteristics suitable for various embodiments and the features thereof are considered within the scope of the present disclosure. As utilized herein, a resistive-switching memory cell can be a two-terminal memory device, which comprises circuit components having conductive contacts (e.g., electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. Examples of a resistive switching two-terminal memory device, though not exhaustive, can include a resistive random access memory (ReRAM), a phase change RAM (PCRAM), a conductive bridging RAM (CBRAM) and a magnetic RAM (MRAM).

One example of a resistive memory device is a filamentary resistive memory cell. Composition of filamentary resistive memory cells, generally speaking, can vary per device with different components selected to achieve desired characteristics (e.g., volatile/non-volatile resistance switching, on/off current ratio, switching time, read time, memory durability, program/erase cycle, and so on). One example of a filamentary resistive memory cell can comprise: a conductive layer, e.g., metal, metal-alloy (including, for instance, a metal-metal alloy such as TiW and others, and various suitable metal-nonmetal alloys), metal-nitride (e.g., comprising TiN, TaN, or other suitable metal-nitride compound), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.), a resistance switching layer (RSL, also referred to as an active layer, resistance switching medium (RSM) or the like), and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer.

A RSL can comprise, e.g., an undoped amorphous Si-containing layer, a semiconductor layer having intrinsic characteristics, a silicon nitride (e.g., SiN, $Si_3N_4$, SiN where x is a positive number, etc.), a Si sub-oxide (e.g., SiOx wherein x has a value between 0.1 and 2), a Si sub-nitride, a metal oxide, a metal nitride, a non-stoichiometric silicon compound, a silicon and nitrogen containing material, a metal and nitrogen containing material, and so forth. Other examples of amorphous and/or non-stoichiometric materials suitable for the RSL could include $Si_XGe_YO_Z$ (where X, Y and Z are respective suitable positive numbers), a silicon oxide (e.g., $SiO_N$, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) other suitable oxides and so forth, a nitride (e.g., AN, SiN), or the like, or a suitable combination thereof (e.g., see below).

In some embodiments, a RSL employed as part of a non-volatile memory device (non-volatile RSL) can include a relatively large number (e.g., compared to a volatile selector device) of material voids or defects to trap neutral metal particles (e.g., at relatively low voltage, e.g., <~3 volts) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Because of the few particle-trapping voids/defects, a conductive filament formed in such an RSL can be quite thin, and unstable absent a suitably high external stimulus (e.g., an electric field, a voltage greater than about 0.5 volts, 1 volt, 1.5 volts, etc., a current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, oxides, nitrides, alloys, or combinations of the foregoing or similar materials can be employed for the active metal-containing layer in some aspects of the subject disclosure. Further, a non-stoichiometric compound, such as a non-stoichiometric metal oxide or metal nitride (e.g., $AlO_x$, $AlN_x$, $CuO_x$, $CuN_x$, $AgO_x$, $AgN_x$, and so forth, where x is a suitable positive number $0<x<2$, which can have differing values for differing ones of the non-stoichiometric compounds) or other suitable metal compound can be employed for the active metal-containing layer, in at least one embodiment.

In some embodiments, a disclosed filamentary resistive switching device can include an active metal layer comprising a metal nitride selected from the group consisting of: $TiN_x$, $TaN_x$, $AlN_x$, $CuN_x$, $WN_x$ and $AgN_x$, where x is a positive number. In a further embodiment(s), the active metal layer can comprise a metal oxide selected from the group consisting of: $TiO_x$, $TaO_x$, $AlO_x$, $CuO_x$, $WO_x$ and $AgO_x$. In yet another embodiment(s), the active metal layer can comprise a metal oxi-nitride selected from the group consisting of: $TiO_aN_b$, $AlO_aN_b$, $CuO_aN_b$, $WO_aN_b$ and $AgO_aN_b$, where a and b are positive numbers. The disclosed filamentary resistive switching device can further comprise a switching layer comprising a switching material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal nitride: $MN_x$, e.g., $AgN_x$, $TiN_x$, $AlN_x$, etc., and the resistive switching layer comprises a metal nitride: $MN_y$, e.g., $AgO_y$, $TiO_y$, $AlO_y$, and so forth, where y and x are positive numbers, and in some cases y is larger than x. In an alternative embodiment of this example, the particle donor layer comprises a metal oxide: $MO_x$, e.g., $AgO_x$, $TiO_x$, $AlO_x$, and so on, and the resistive switching layer comprises a metal oxide: $MO_y$, e.g., $AgO_y$, $TiO_y$, $AlO_y$, or the like, where y and x are positive numbers, and in some cases y is larger than x. In yet another alternative, the metal compound of the particle donor layer is a $MN_x$ (e.g., $AgN_x$, $TiN_x$, $AlN_x$, etc.), and the resistive switching layer is selected from a group consisting of $MO_y$ (e.g., $AgO_y$, $TiO_y$, $AlO_y$, etc.) and $SiO_y$, where comparative atomic weights: x and y can be suitable stoichiometric or non-stoichiometric values throughout this disclosure. As utilized herein, variables x, a, b, and so forth representative of values or ratios of one element with respect to another (or others) in a compound can have different values suitable for respective compounds, and are not intended to denote a same or similar value or ratio among the compounds.

As mentioned above, applying a program voltage (also referred to as a "program pulse") to one of the electrodes of the two-terminal memory can cause a conductive filament to form in an interface layer (e.g., a RSL). By convention and as generally described herein, the TE receives the program pulse and the BE is grounded (or held at lower voltage or opposite polarity compared to the program pulse), but such is not intended to be limiting for all embodiments. Conversely, applying an "erase pulse" to one of the electrodes (generally a pulse of opposite polarity as the program pulse or to the opposite electrode as the program pulse) can break continuity of the filament, e.g., by driving the metal particles or other material that forms the filament back toward the active metal source for the non-volatile filamentary device. For a volatile filamentary device, reducing voltage below an activation threshold voltage (or a hold voltage in some embodiments) can result in dispersion of metal particles forming a volatile filament, resulting in discontinuity of the volatile filament. Properties of this conductive filament as well as its presence or absence affect the electrical characteristics of the two-terminal memory cell such as, for example, lowering the resistance and/or increasing conductance across the two terminals when the conductive filament is present as opposed to when not present.

Following program or erase pulses, a read pulse can be asserted. This read pulse is typically lower in magnitude relative to program or erase pulses and typically insufficient to affect the conductive filament and/or change the state of the two-terminal (non-volatile) memory cell. By applying a read pulse to one of the electrodes of the two-terminal memory, a measured current (e.g., $I_{on}$) can be indicative of the conductive state of the two-terminal memory cell. For example, when the conductive filament has been formed (e.g., in response to application of a program pulse), the conductance of the cell is greater than otherwise and the measured current (e.g., $I_{on}$) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (e.g., $I_{off}$) reading in response to the read pulse will be lower.

By convention, when the conductive filament is formed, the memory cell is said to be in the "on-state" with a high conductance. When the conductive filament is not extant, the memory cell is said to be in the "off-state." A non-volatile memory cell being in the on-state or the off-state can be logically mapped to binary values such as, e.g., "1" and "0." It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information. Embodiments of the present disclosure, by incorporating MLC memory cells in place of SLC memory, can increase capacity of disclosed memory arrays proportional to a number of bits per MLC memory cell (e.g., dual-bit MLC cells can double disclosed memory capacities, quad-bit MLC cells can quadruple disclosed memory capacities, and so on).

As utilized herein, resistive memory structures can be formed as two dimensional (2D) arrays among intersecting conductive lines of an IC chip, such as among back-end-of-line conductive lines (e.g., metal, metal alloy/compound, doped semiconductor, etc.). Stacking multiple two dimensional arrays can effect a three dimensional (3D) array referred to as a 3D crossbar array. In the 3D crossbar array, a two-terminal memory cell is formed at an intersection of two metal lines within each 2D array, and multiple such 2D arrays stacked one over another form a 3D crossbar structure. Two general conventions are provided for arrangement of memory cells in a 2D or 3D array. A first convention is the 1T1R memory array, in which each memory cell is isolated from electrical effects (e.g., current, including leak path current(s)) of surrounding circuitry by an associated transistor. A second convention is the 1TnR memory array (n being a positive number greater than one), where a sub-array of multiple memory cells (e.g., 2K×2K cells, or other suitable array size) is isolated from electrical effects of surrounding circuitry and sub-arrays by a single transistor (or group of transistors). In the 1TnR context, individual memory cells can include a selector device (e.g., a volatile, two-terminal filamentary resistance device) in electrical series with a two-terminal non-volatile memory cell between intersecting conductive lines of a crossbar array. The selector device has very high off-resistance, and when voltage applied across the conductive lines is lower than an activation magnitude of the selector device the selector device can greatly suppress current leakage between the conductive lines. Since two-terminal memory cells can be fabricated with thin films much smaller than transistors, and can be highly scalable, 1TnR arrays having large values of n can result in very high memory densities.

Example Monolithic Computing Architectures

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure can be practiced without these specific details, or with other methods, components, materials, etc. In other instances, well-known structures and devices are shown in block diagram form to facilitate describing the subject disclosure.

FIG. 1 illustrates a block diagram of an example monolithic sub-chip level computing architecture 100 according to one or more embodiments of the present disclosure. In some embodiments, computing architecture 100 can form a portion of a monolithic network-on-chip architecture. Particularly, computing architecture 100 can comprise multiple processor tiles 104NM connected with a number X of resistive memory sub-arrays 130 serving a non-volatile system memory (e.g., random access memory, or RAM) for the multiple processor tiles. The resistive memory sub-arrays 130 leverage the high density and scalability of two-terminal resistive memory technology (e.g., resistive-switching, two-terminal memory, also referred to as resistive random access memory, or ReRAM), to achieve large memory capacities for the embedded non-volatile system memory. Reduced power consumption and simplified power maintenance circuitry can be achieved for computing architecture 100 due to non-volatility of the system memory. In addition, small or custom-sized memory access requests can maximize useful data throughputs for computing architecture 100. Still further, by implementing massive memory parallelism, total data throughputs approaching and even exceeding modem DRAM memory systems can be achieved by various disclosed embodiments, resulting in a significant improvement in embedded system-on-chip (or network-on-chip) architectures by the present disclosure.

As illustrated, computing architecture 100 can comprise a substrate layer 110 comprising logic circuitry and other active device circuitry, including multiple processor tiles 104$_{NM}$, where N and M are suitable positive integers. In an embodiment, substrate layer 110 comprises N×M processor tiles. In particular embodiments, N×M comprises a number selected from a group consisting of: 64 processor tiles, 128 processor tiles, 256 processor tiles and 512 processor tiles. In other embodiments, substrate layer 110 can comprise other numbers of processor tiles (e.g., 8, 16 or 32 processor tiles, 1024 processor tiles, 2048 processor tiles, or other suitable number).

Above substrate layer 110 is a number of backend layers 115. Backend layers 115 lie above substrate layer 110 and can wholly or partially overlap processor tiles 104$_{NM}$. Not depicted in computing architecture 100 (but see, e.g., FIGS. 2 and 3, among others) are memory access circuitry for electrical access to backend layers 115, including resistive memory (ReMEM) banks fabricated among the backend layers 115. The memory access circuitry can include row and column controls, sense arrays, voltage and current control circuitry, multiplexers, clock source(s), and so on (e.g., see FIG. 4 and FIG. 14, infra). Backend layers can partially or wholly overlie the memory access circuitry, as well as other active or passive components formed in substrate layer 110.

Processor tiles 104$_{NM}$ formed on substrate layer 110 can be formed of CMOS fabrication processes. Additionally, memory access circuits for accessing and controlling ReMEM banks 130 can be formed of CMOS fabrication processes. The logic and access circuitry can be formed entirely or at least partially with front-end-of-line CMOS processing, as an example. Additionally, ReMEM banks 130 can be also be formed of CMOS processing, including back-end-of-line CMOS processing, at least in part. This facilitates integration of a single monolithic chip including substrate layer 110 as well as backend layers 115 in a single die or wafer (e.g., a 20 mm×20 mm chip, or other suitable size chip).

An example component diagram of each processor tile 104 is illustrated by processor tile 120. Processor tile 120 can comprise a process core (or multiple cores) 122, including logic circuitry formed on substrate layer 110. In addition, a cache memory and cache controller 124 can be provided for caching data associated with one or more process threads executed by process core(s) 122, retrieving cached data, in response to a cache hit, or issuing a memory request to one or more of X ReMEM banks 130 in response to a cache miss, as one example, where X is a suitable positive integer. Within processor tile 120 (or adjacent to processor tile 120 in some embodiments), can be memory access circuitry to provide electrical connection and control components enabling independent access to each of the X ReMEM banks 130.

As illustrated, processor tile 120 can include one or more memory controllers 125 to facilitate performance of memory operations on ReMEM banks 130 connected to processor tile 120. Memory controllers 125 can be configured to be operable in conjunction with physical requirements of resistive memory cells forming the ReMEM banks 130. Example configurations include read latency configurations, write latency configurations, overwrite configurations, power control for activating/deactivating subsets of ReMEM banks 130, or for activating one or more bits or bytes of memory included in ReMEM banks 130, address decoding for identifying physical locations of memory cells identified by memory requests, error correction encodings and instructions, data validation instructions for validating correct read or write results, and so forth. In some embodiments, processor tile 120 comprises multiple memory controllers 125 per processor core 122. As one example, processor tile 120 can comprise three memory controllers per processor core (e.g., see FIG. 7, infra). As an alternative example, processor tile 120 can comprise eight memory controllers per processor core (e.g., see FIG. 8, infra). In still other embodiments, other suitable numbers of memory controllers can be provided per processor core 122.

Memory controller(s) 125 can also operate with stored multi-data instruction sets 126. Multi-data instruction sets can provide instruction and rules for issuing multiple concurrent memory requests for processor core 122 (or each processor core 122, in the event of multiple cores per tile). One example includes a multithreading instruction set for issuing at least one memory request to system memory (e.g., ReMEM banks 130) per thread executing on processor core(s) 122. According to this example, processor core(s) 122 is capable of executing n threads concurrently, n being a suitable positive integer (e.g., 4 threads, or other suitable number). Another example of multi-data instruction sets includes single instruction multi-data (SIMD) instructions. This type of multi-data instruction set refers to an instruction (single-instruction) implemented in parallel on multiple processing cores, or within multiple process threads, or the like, utilizing different data sets (multiple-data). Scatter-gather is an example SIMD instruction that can be incorporated within the multi-data instruction sets operable with memory controller(s) 125. In general, SIMD instructions can be described as vector instructions that are extensions to a normal scalar instruction set. Scatter-gather refers to one type of SIMD instruction that can perform multiple, y, memory operations (e.g., to disparate physical memory access locations) within a given instruction, thereby permitting multiple reads or writes from the same SIMD instruction at non-contiguous memory addesses. For y memory operations, also referred to as y-way scatter-gather (e.g., 8-way scatter gather, or other suitable integer), y*n physical location accesses can be issued by memory controller(s) 125 per processor core(s) 122, concurrently. As yet another example, multi-data instruction sets 126 can include non-blocking scatter-gather SIMD instructions, in which multiple non-blocking memory requests of process core(s) 122 (or of cache controller 124) are organized in sequence by memory controller(s) 125 per process thread of processor core(s) 122. Non-blocking memory requests are memory requests that can be completed or otherwise executed independent of other memory requests, and thus can be issued concurrently by processor core(s) 122 (or cache controller 124) without stalling activity on the processor core(s) 122.

Multiple non-blocking memory requests, for example z memory requests, can be organized by memory controller 125 to be issued consecutively, per n process thread, each having y physical location accesses defined. This can result in z*y*n concurrent physical memory accesses per processor core(s) 122, achieving massive memory parallelism between processor core(s) 122 and resistive system memory of computing architecture 100. In one or more embodiments, memory controller 125 can be configured to stack 8-deep non-blocking memory requests in sequence and issue physical memory requests to 8*y sub-arrays of resistive system memory (e.g., each sub-array being a subset of ReMEM banks 130, see FIG. 2, although including sub-arrays within memory banks connected to other processor tiles 104$_{NM}$ and associated memory controllers). As an illustrative and non-limiting example, where multi-data instruction set 126 is configured for 8-deep non-blocking organization, 8-way scatter gather instruction, and 4-thread per core execution, memory controller 125 can concurrently issue 8*8*4 or 256 memory requests per processor core(s) 122 (or per cache controller 124). This example is in no way limiting, however, and other suitable values of n process threads, y-way scatter-gather implementation and z-deep non-blocking request organization can be achieved by computing architecture 100, and other computing architectures of network-on-chip systems disclosed herein.

To facilitate access to system memory connected to different processor tiles 104$_{NM}$, processor tile 120 can include a router device 128. Router device 128 can be configured for distributing commands and data to other processor tiles 104$_{NM}$ 104, and receiving commands and data from other processor tiles 104$_{NM}$ 104. As an operational example, processor core(s) 122 (or cache controller 124), upon decoding a memory address associated with a ReMEM bank 130 connected to processor tile 104$_{01}$ (e.g., in response to a cache miss, or other request from processor core(s) 122), can issue a memory command (e.g., read, write, overwrite, etc.) to processor tile 104$_{01}$. A router device 128 located on such processor tile will receive the memory command and provide it to an associated memory controller(s) 125 of processor tile 104$_{01}$. Acknowledgment or data associated with the memory request can be returned by the router device 128 of processor tile 104$_{01}$ to processor core(s) 122 (or cache controller 124) of processor tile 120. As a result, processor core(s) 122/cache controller 124 of processor tile 120 can access not only the X ReMEM banks 130 connected to processor tile 120, but any ReMEM bank included within computing architecture 100, as one example embodiment.

Individual memory cells of ReMEM banks 130 can comprise a series combination of a volatile resistance switching selector device and a non-volatile resistance switching memory cell. As a result, each ReMEM bank 130 can be embodied by a plurality of 1TnR sub-arrays. In an embodiment, n=2048×2048 memory cells, although other size 1TnR sub-arrays can be provided in various embodiments of the disclosed computing architectures. In alternative embodiments, a sub-array can be accessed by a set of multiple transistors. In these embodiments, instead of 1TnR, a sub-array could be 2TnR, 4TnR, or other suitable number.

Figure 2:
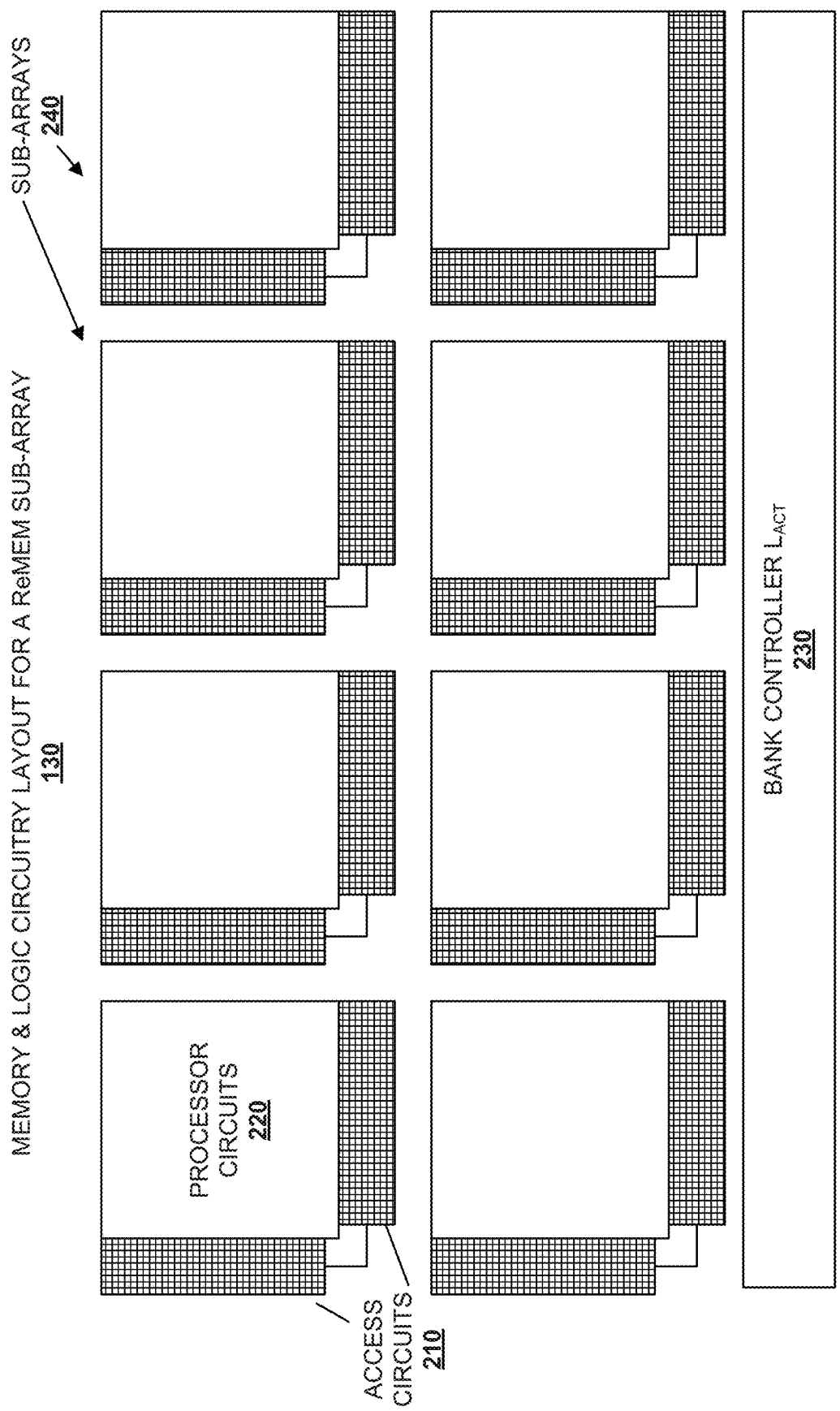
FIG. 2 illustrates a block diagram of a sample circuitry layout for a portion of a substrate in a disclosed monolithic computing architecture according to further embodiments.

FIG. 2 illustrates a block diagram of example circuitry layout for independent sub-arrays 240 of ReMEM bank 130 of FIG. 1, supra. In the embodiment of FIG. 2, ReMEM bank 130 is managed by a bank controller 230. Bank controller 230 activates up to L-independently activatable sub-arrays 240 of ReMEM bank 130. As depicted by FIG. 2, ReMEM bank 130 includes 8 independently activatable sub-arrays 240, though ReMEM bank 130 can be organized into other numbers of sub-arrays in various embodiments (e.g., 2 sub-arrays, 4 sub-arrays, 16 sub-arrays, 32 sub-arrays, etc.). Thus, the number of independently activatable sub-arrays $L_{act}$ can vary according to one or more embodiments, and in at least one embodiment, can be determined dynamically, e.g., in response to a request-size attribute of a read/write request.

Access circuits 210 dedicated to each sub-array 240 are provided. Access circuits 210 are formed in part or in whole within a substrate (e.g., substrate layer 110 of FIG. 1, supra), and resistive memory cells associated with the sub-arrays 240 are formed above the substrate (e.g., among back-end-of-line layers). Adjacent to the access circuits 210, also formed in the substrate, are logic circuits 220 that form processor core(s) 122 of processor tile 120. As provided in FIG. 2, access circuits 210 and processor circuits 220 are arranged within a footprint of resistive memory sub-arrays 240, on the substrate of an IC chip (e.g., see FIG. 3, infra). This can facilitate compact architectural design, maximizing numbers of processor cores as well as ReMEM banks 130 and resistive memory sub-arrays 240. Proximity of processor cores to ReMEM banks 130 can also reduce power consumption and maximize efficiency associated with a main memory access.

In at least one embodiment, ReMEM banks 130 can be replicated across an IC die and above the substrate of the IC die. Given a particular die size and sub-array size, a given number $N_{sa}$ of resistive memory sub-arrays 240 can be formed on the chip. Likewise, based on area consumed by access circuits 210 and processor circuits 220, a number $N_{core}$ of processor cores can be formed on the chip.

In operation, a given main memory access (e.g., an access to a ReMEM bank 130) causes bank controller 230 to activate a number of resistive memory sub-arrays 240 equal to $L_{act}$. Bank controller 230 acquires a number of bits from each activated sub-array 240, aggregates and then returns the acquired bits in response to the main memory access. The number of bits retrieved from each sub-array×$L_{act}$ (the number of sub-arrays activated)=the fetch size for a given memory bank. The number of bits retrieved per sub-array can be configured upon fabrication of a disclosed computing architecture, or can be selectively programmed in post-fabrication configurations. Unlike DRAM, resistive memory in a crossbar array is decoupled from a page size of the crossbar array. In other words, the granularity of data movement into and out of sub-arrays is not tied to the sub-array page size. Rather, any number of memory cells can be activated by individually applying appropriate voltages to selected crosspoint cells of interest (e.g., up to a number of memory cells that can be activated by a maximum wordline current on which the page is connected). Even if a large page size is chosen (e.g., to better amortize the substrate area consumed by access circuits), the fetch size for that page can be as small as 1 bit, or as large as the maximum wordline current can support, or any suitable number there between (e.g., 2 bits, 4 bits, 8 bits, etc.), and can be dynamically configured post-fabrication in some embodiments.

As provided above, a grouping of sub-arrays equal to $L_{act}$ forms a single ReMEM bank 130. In some embodiments, bank controller 230 can be configured to vary $L_{act}$ per memory request, thereby varying the fetch size of a given ReMEM bank 130. For instance, where a sub-array fetch size is set to 1 byte, bank controller 230 can fetch a total of 4 bytes for a given memory transaction by activating and performing a sub-array fetch on four (4) sub-arrays 240. In other embodiments, $L_{act}$ is fixed for each bank controller 230, and thus the minimum memory requests granularity is expressed by multiples of the sub-array fetch size×$L_{act}$. In these latter embodiments then, for $L_{act}$ of 8 as illustrated in FIG. 2, a minimum fetch size would be 8× sub-array fetch (e.g., 8 bytes for a sub-array fetch size of 1 byte, 4 bytes for a sub-array fetch size of 4 bits, and so on). Larger memory requests can be achieved by activating multiple ReMEM banks 130. To access a standard cache block of 64 bytes, as yet another example, 64 sub-arrays within 8 different ReMEM banks 130 could be activated (with a sub-array fetch size of 1 byte) to acquire 64 bytes of data. In these embodiments, a disclosed computing architecture can dynamically vary a total fetch size for a given memory transaction by configuring a bank controller 230 to activate a suitable number of sub-arrays 240 in response to the memory transaction.

With one controller 230 per bank, a maximum number of outstanding memory requests at any given time (equal to the number of ReMEM banks 130) is $N_{sa}/N_{act}$. Different embodiments of the present disclosure can have different amounts of memory parallelism. In an embodiment where total main memory includes ~2 thousand (K)×~2K sub-arrays per 2D crossbar layer (or more precisely 2048×2048 sub-arrays, in one particular example) and a 400 mm² die, the number of sub-arrays, $N_{sa}$, could be ~64K sub-arrays. In an embodiment where Lau is equal to 8, for example, a disclosed computing architecture can support up to ~8K outstanding concurrent main memory requests across the IC chip.

Maximum chip-wide memory parallelism is achieved when all memory requests use the minimum fetch size. If individual memory requests fetch more than the minimum amount of data, there are effectively fewer resistive memory banks available for independent memory requests. Nevertheless, targeting the largest amount of memory parallelism for small fetch sizes is useful, for instance, with memory-intensive applications having irregular memory access patterns that lack spatial reuse. Many applications, including graph computations and sparse matrix workloads, exhibit these characteristics and can maximize parallelism of disclosed computing architectures.

Figure 3:
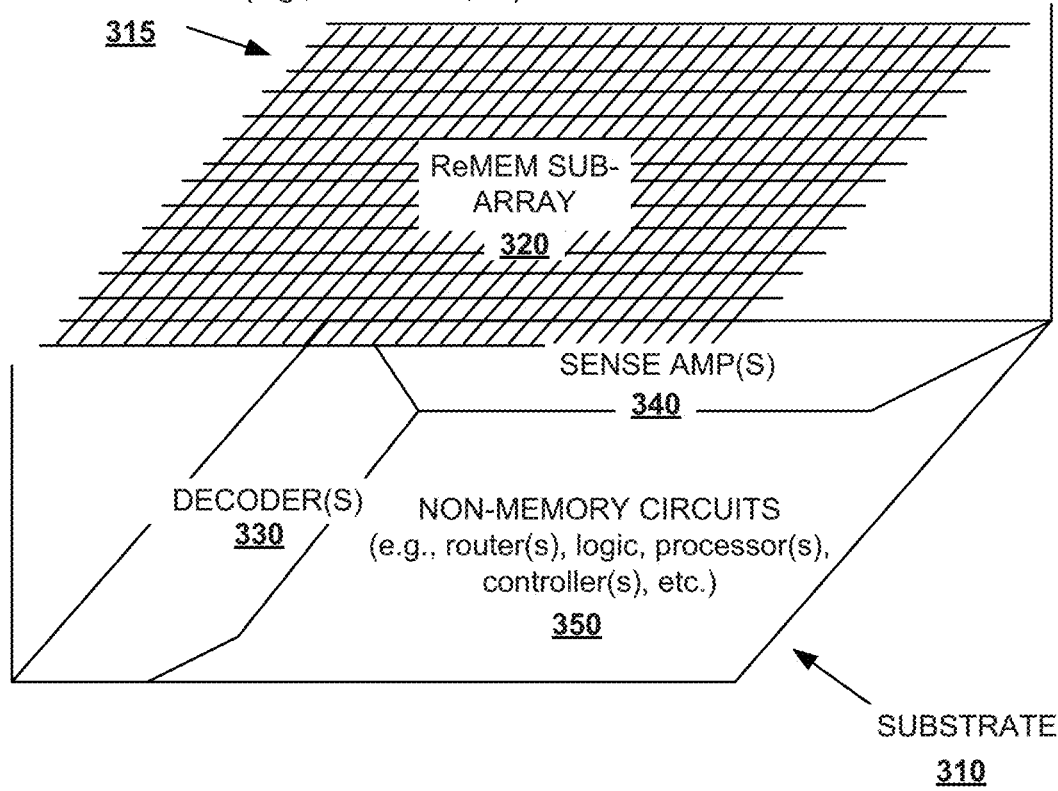
FIG. 3 illustrates a diagram of a perspective view of a monolithic computing device having resistive system memory overlying substrate circuitry, in an embodiment(s).
Figure 3:
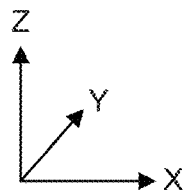

FIG. 3 illustrates a perspective view of an example resistive memory sub-array 300 of a disclosed monolithic computing architecture according to alternative or additional embodiments of the present disclosure. Sub-array 300 includes a substrate 310 layer at a base of an IC die, and one or more layers 315 above the substrate 310 (e.g., back-end layers). An example layout of logic circuits and memory access circuits, within a footprint of, and therefore underlying, resistive memory sub-array 320 of resistive main memory is illustrated. The example layout provides memory access decoders 330 along a first edge of substrate 310 and memory access sense amp(s) 340 along a second edge of substrate 310, perpendicular to the first edge. Remaining area of substrate 310 includes non-memory circuits 350, which can include logic circuitry, memory controller circuitry, router device circuitry, cache memory and cache controller circuitry, power control circuitry, multiplexers for routing power, connectors for routing data or instructions, among other suitable active or passive logic devices for a processor device (e.g., a process core). It should be understood that such a processor device, also referred to herein as a process core, can include a general purpose processor, such as a central processing unit (CPU) or a special purpose processor such as an accelerator (e.g., graphics processing unit (GPU), etc.), or any other suitable CMOS processing structure.

In the arrangement depicted by FIG. 3, one set of access circuits is provided for resistive memory sub-array 300 (and by implication, other resistive memory sub-arrays adjacent to resistive memory sub-array 300 within a disclosed monolithic computing architecture). As a result, amortization of access circuitry is greatest when sub-arrays are larger in size, enabling more area for integrating CPU logic. For example, for sub-arrays comprising ~2K×~2K memory cells, assuming a 16 nm technology node for the resistive memory, one embodiment utilizes approximately 26% of area underneath a sub-array for access circuitry (e.g., including access decoders 330 plus sense amps 340), leaving 74% of the area for non-memory circuits 350. For embodiments utilizing different process technologies (e.g., 14 nm, 12 nm, 7 nm, etc., or even larger process technologies in some embodiments: 22 nm, 28 nm, and so forth), different amortization of substrate area is achieved by access circuits and process circuits. In general, by implementing logic circuitry beneath a set of memory sub-arrays, all in a single IC die (e.g., with a fine-meshed integration of logic circuitry and access circuitry), distance between processor cores and main memory can be minimized, and large numbers of conductive lines interconnecting the processor cores and main memory can be provided (e.g., hundreds of thousands or millions of wires, as available in modern VLSI fabrication, but also including larger numbers of conductive lines available in future semiconductor fabrication techniques). The high degree of interconnectivity between process cores (e.g., 64 or more process cores) and independently accessible memory banks (e.g., 8K or larger independent sub-arrays, per 2D crossbar structure) facilitates very high processor—main memory interconnectivity, and as a result, extremely high memory access parallelism. Physical proximity between non-memory circuits 350 and resistive memory sub-arrays 320 can significantly reduce power consumption associated with main memory access requests.

One difference between disclosed resistive switching memory and, for example, DRAM is the longer read latencies (and write latencies) of resistive switching memory. For example, read latencies on the order of hundreds of nanoseconds are observed in some resistive memory technologies. To achieve similar or greater main memory throughput as available in DRAM systems, high parallelism—issuing very large numbers of memory access requests per clock cycle (or group of clock cycles), which can be executed concurrently by a corresponding large number of memory banks—is provided to achieve high throughputs despite longer latencies. Further, the large interconnectivity between process cores and memory banks can be utilized to embody a very large data path (e.g., 256 bits, or larger). In some embodiments, a disclosed computing architecture can achieve 23.4 Giga Traversed Edges per Second (GTEPS) with 16K-way memory parallelism, compared with 2.5 GTEPS for a DRAM system with total data throughput of 320 GB/s. Additionally, better access granularity (e.g., 8 bytes, 4 bytes, 1 byte, etc.) can facilitate higher useful data throughput, as compared with DRAM that retrieves data in minimum 128-byte blocks per memory access.

Table 1 provides example embodiments of disclosed monolithic computing architectures, though the subject disclosure is not limited to those embodiments. One advantage of disclosed monolithic computing architectures is scalability of components. For instance, when scaling the number of processor tiles 120, core count will increase and a number of memory controllers 125 will increase as well, providing more access points into the ReMEM sub-arrays 130. Generally, the number of sub-arrays $N_{sa}$ for a given chip design remains fixed. Accordingly, increasing the number of processor tiles 120 also reduces the amount of resistive memory sub-arrays controlled by each memory controller 125. As provided in Table 1, the number of resistive memory sub-arrays and resistive memory banks per processor tile 120 is given for increasing numbers of processor tiles 120: from 64 to 1024 processor tiles 120 (e.g., for an embodiment(s) having $N_{sa}$=64K and $L_{act}$=8; see FIG. 2, supra). Similarly, increasing the number of processor tiles 120 increases the number of router devices 128, providing greater network capacity for routing memory request packets between cores and memory controllers 125. In other words, processor tile 120 scaling increases parallelism of both the computing architecture and the memory controllers, while reducing the number of resistive memory banks per memory controller. The number of processor tiles 120 significantly increases/decreases system memory parallelism.

TABLE 1

Number of sub-arrays and memory banks per processor tile 120 for differing numbers of processor tiles, and for embodiments in which $N_{sa}$ = 64K and $L_{act}$ = 8

| Number of Processor Tiles | 64 | 128 | 256 | 512 | 1024 |
|---|---|---|---|---|---|
| Sub-Arrays per Tile | 1024 | 512 | 256 | 128 | 64 |
| Banks per Tile | 128 | 64 | 32 | 16 | 8 |

Figure 4:
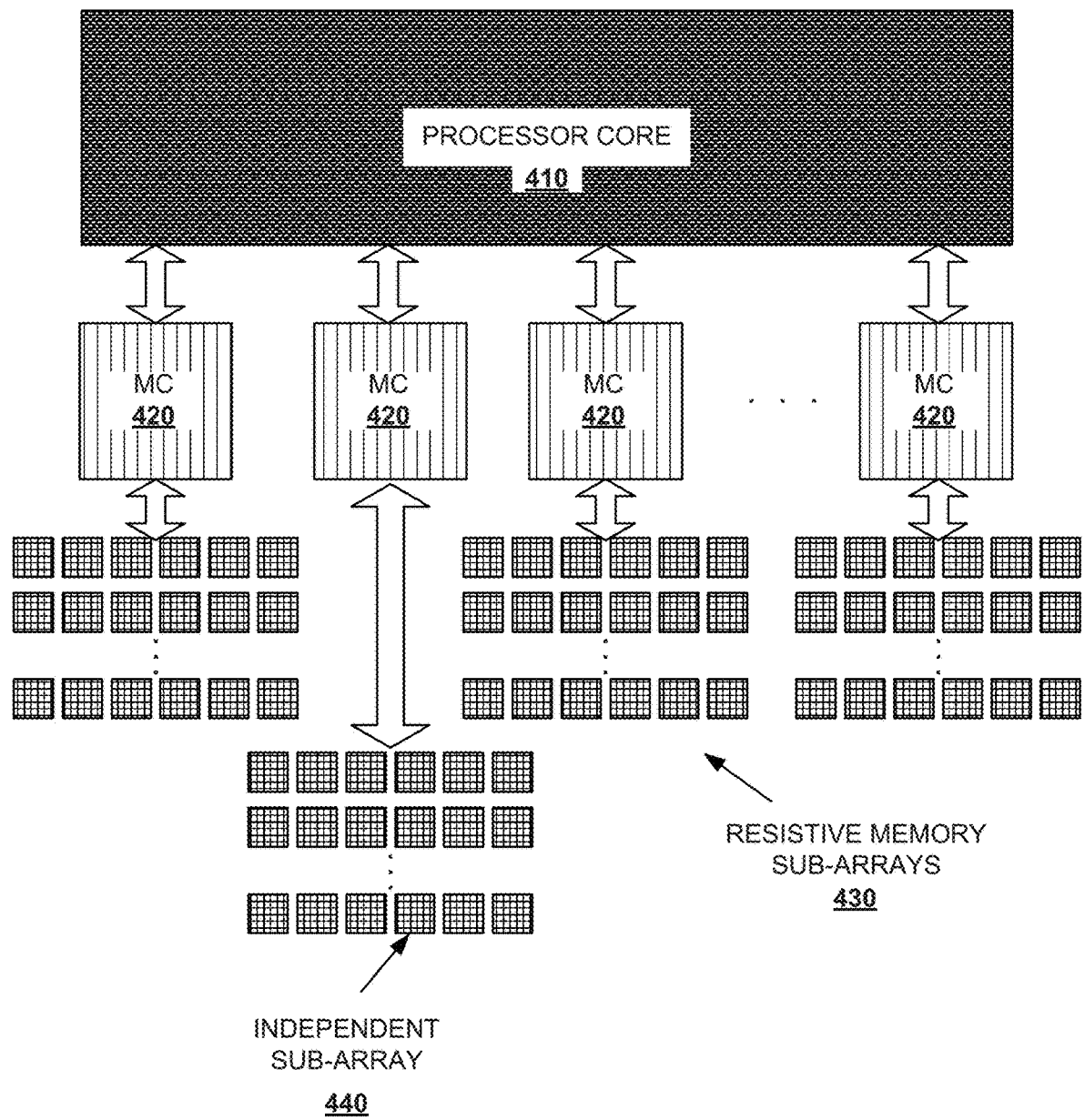
FIG. 4 depicts a block diagram of sample operational arrangement for memory access to embedded resistive system memory for a disclosed monolithic computing device.

FIG. 4 illustrates a block diagram of an example monolithic sub-chip level computing architecture 400 according to still additional embodiments of the disclosure. Computing architecture 400 illustrates a multiple memory controller per processor core architecture to facilitate the high system memory parallelism of the disclosed computing architectures. A processor core 410 is communicatively connected with multiple memory controllers 420. Each memory controller 420 is likewise connected with a set of resistive memory sub-arrays 430 comprising multiple independent sub-arrays 440. Because processor core 410 is connected to many independent sub-arrays 440 through the multiple memory controllers 420, processor core 410 can generate numerous memory requests that can be executed concurrently on the independent sub-arrays 440. This allows processor core 410 to amortize the relatively long access latency of the independent sub-arrays 440 (e.g., hundreds of nanoseconds) among many memory requests, achieving high total throughput.

A general equation for degree of parallelism to support a desired bandwidth, given an access time, is as follows:

Memory Parallelism=bytes/sec*sec/access*access/bytes

The equation above gives desired bandwidth in the first term: bytes/sec, access latency in the second term: sec/access, and number of bytes delivered per access in the third term: access/bytes. Consider a matrix multiplication problem executed on multiple cores, having a sustained rate of two 64-bit floating-point multiply-accumulate operations per cycle, for cores operating at 1 GHz. Desired bandwidth is 4×8 bytes/nanosecond=32 GB/s. For main memory access equal to 8 bytes per access (e.g., to facilitate reasonably high access granularity and good useful data throughput), then minimum parallelism per core, given a 200-nanosecond access time would be:

32 bytes/ns*200 ns/access*access/8 bytes=800 The result, 800, is a number of concurrent memory requests that computing architecture 400 is required to handle, per core, to sustain the 32 GB/s data rate given a 200-ns access time and accessing 8 bytes per access. As access times increase, the required parallelism increases proportionately. For instance, a 500-ns access time would require 2.5 times greater parallelism, or 2000 concurrent memory requests per core. This parallelism exceeds the capabilities of conventional main memory (e.g., DRAM) by several orders of magnitude.

It should be appreciated that the above requirements do not mandate 800 or 2000 memory channels per core, but rather that the memory system must be able to manage the above number of simultaneous requests overlapping in time. For instance, each of memory controllers 420 can control multiple banks of memory concurrently, each of which can be in a different state, allowing each memory controller 420 to "pipeline" multiple memory requests concurrently.

Figure 5:
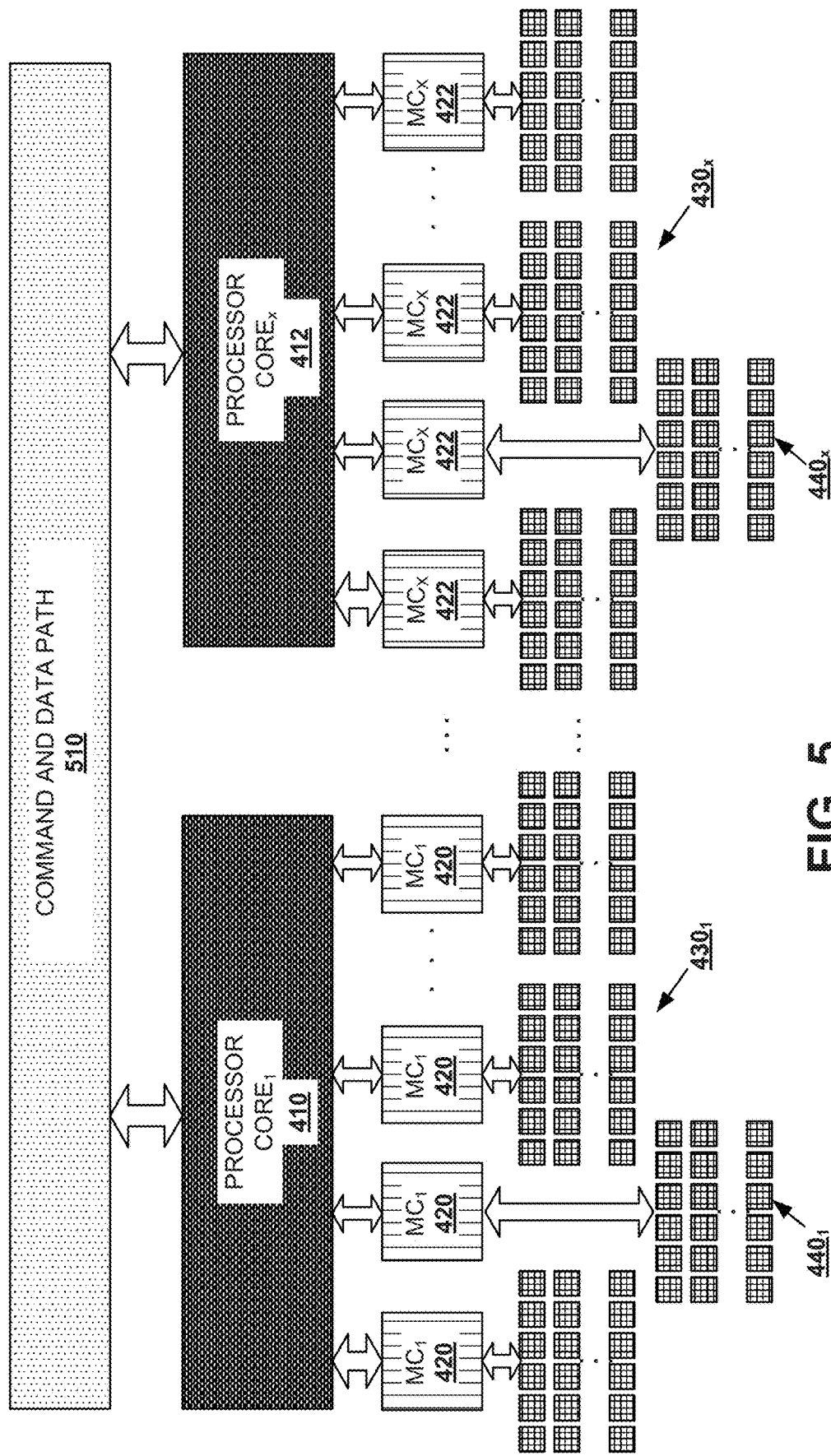
FIG. 5 illustrates a block diagram of a network-on-chip architecture for embedded memory access by multiple process cores of a disclosed IC chip, in an embodiment(s).
Figure 6:
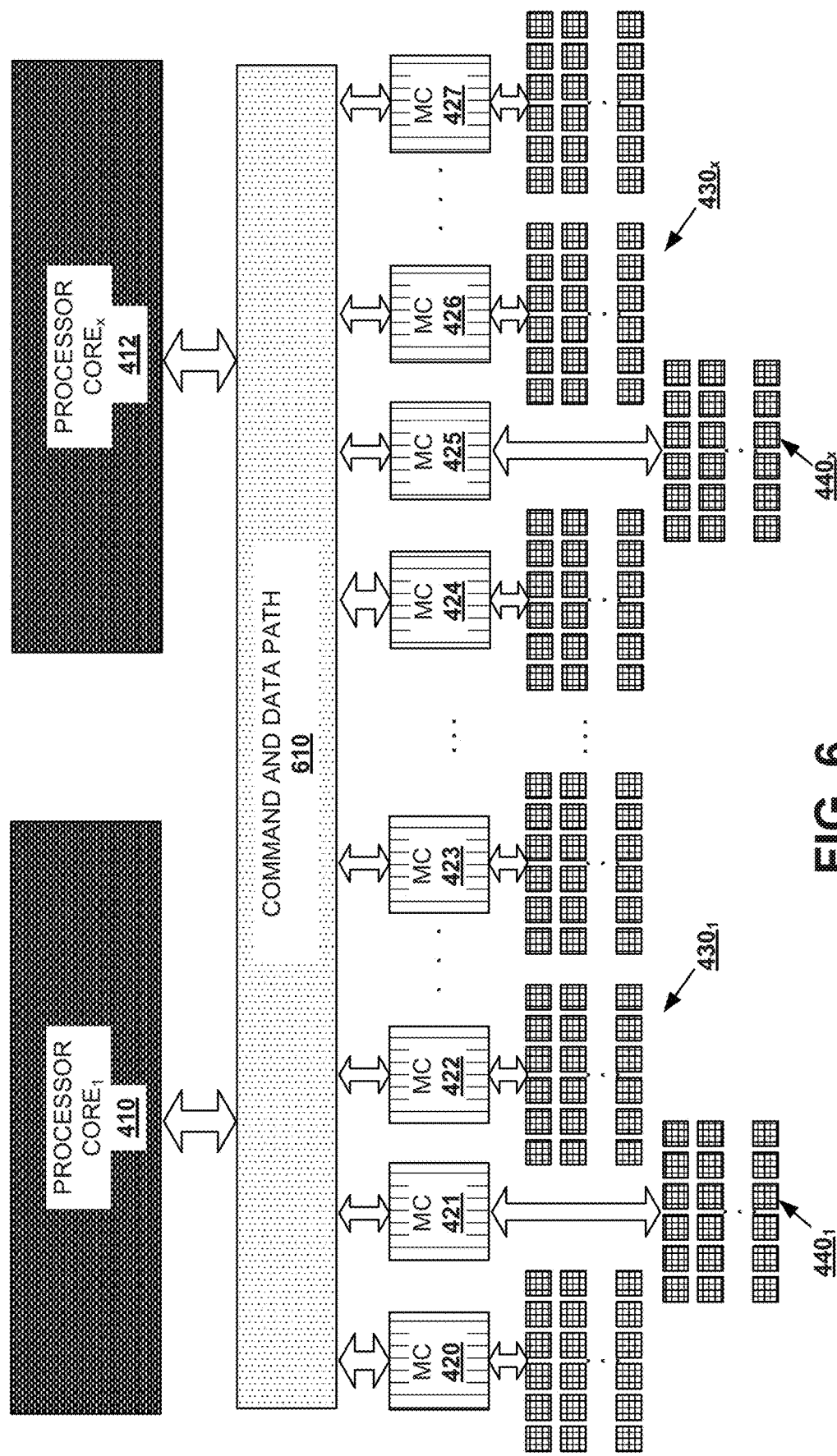
FIG. 6 depicts a block diagram of a network-on-chip architecture for multicore embedded memory access according to further disclosed embodiments.

Referring now to FIG. 5, an embodiment is depicted of an example monolithic multi-processor network-on-chip (NoC) architecture 500. NoC architecture 500 provides a command and data path 510, to which is connected multiple processor cores, including processor core$_1$ 410 through processor core$_x$ 412, where x is a suitable number greater than 1 (e.g., 32, 64, 128, 256, 512, etc.). The processor cores are referred to hereinafter collectively as processor cores$_{1-x}$ 410-412. Each of processor cores$_{1-x}$ 410-412 is connected to a separate memory subsystem, each including multiple memory controllers$_{1-x}$ 420-422 respectively connected to respective sets of memory sub-arrays 430$_1$ ... 430$_x$. Each set of memory sub-arrays 430$_1$ ... 430$_x$ connected to a memory controller comprises multiple independently accessing memory sub-arrays 440$_1$-440$_x$. Routing devices associated with each processor core (not depicted, but see FIG. 1, supra) can issue memory access requests to different memory sub systems over the command and data path 510, where suitable. For instance, if a memory request issued by processor core$_1$ 410$_1$ contains a data location at an independent sub-array 440$_x$ within a set of memory sub-arrays 430$_x$ of processor core$_x$ 412, the data location and memory request can be submitted by the routing device onto command and data path 510, and received by a corresponding routing device connected to processor core$_x$ 412. Upon serving the memory request from data location of the independent sub-array 440$_x$, acknowledgment or data is returned on command and data path 510 and received at processor core$_1$ 410. Similar processes embodying multiple memory requests to multiple physical data locations originating at multiple cores and targeting memory sub-systems among multiple other cores (or some of the same cores) can be accommodated by NoC architecture 500, as would be understood by one of ordinary skill in the art by way of the context provided herein.

Where an application for a NoC computing architecture expects significant data sharing between threads and cores of a multicore system, significant congestion can occur on a data and communication path 510 interconnecting the multiple cores. Congestion can result, for instance, within routers connecting each core to the data and communication path 510, as requests for non-local data must go through and utilize routers attached to other cores. FIG. 6 illustrates a monolithic multi-processor network-on-chip computing architecture 600 according to alternative or additional embodiments that can minimize NoC congestion. Computing architecture 600 can manage both a simpler application with little memory request sharing among cores (and associated memory sub-systems), as well as the congestive case involving significant sharing between cores and memory sub-systems. Computing architecture 600 places memory controllers 410-427 as endpoints on data and communication path 610, enabling equal bandwidth to each memory controller 410-427 on the NoC. Computing architecture 600 creates a truly distributed main memory, with cores 410-412 acting as clients of memory controllers 410-427, rather than owners thereof.

Figure 7:
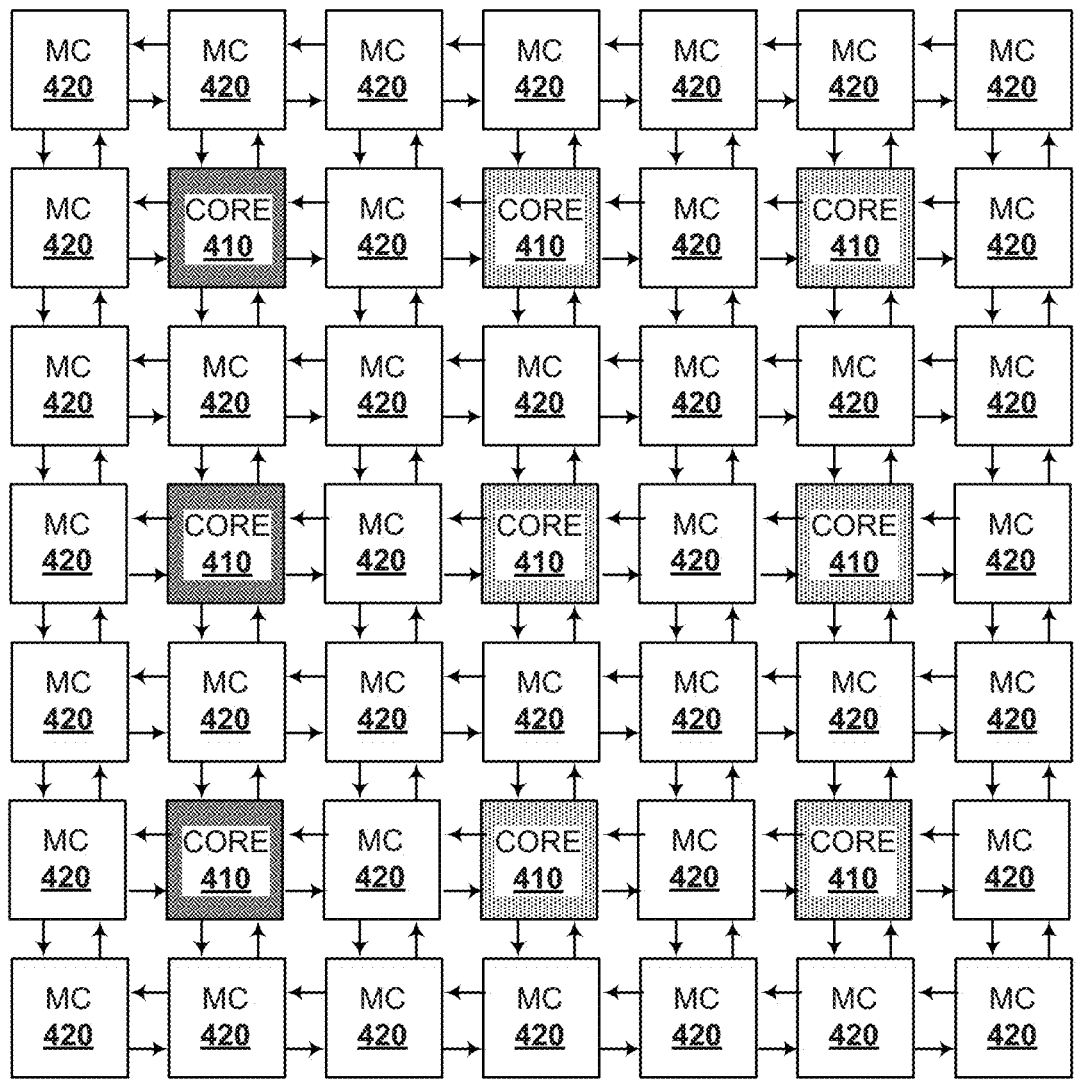
FIG. 7 illustrates an example 2D arrangement of process core and memory controller devices for a monolithic IC computing architecture, in one or more disclosed aspects.

FIG. 7 depicts an example 2D arrangement 700 of process cores and memory controllers for disclosed NoC computing architectures, in further disclosed embodiments. 2D arrangement 700 includes 3 memory controllers 420 per processor core 410, further facilitating high memory parallelism. Each processor core 410 can exchange commands and data between connected memory controllers 420, and each memory controller 420 can likewise send and receive data and commands with other connected memory controllers 420. The arrangement of memory controllers 420 and processor cores 410 can be conceptual (depicting interactivity, but not physical location of associated memory circuits and logic circuits), or can reflect a physical arrangement of memory circuits and logic circuits on a substrate of the corresponding memory controllers 420 and processor cores 410.

Figure 8:
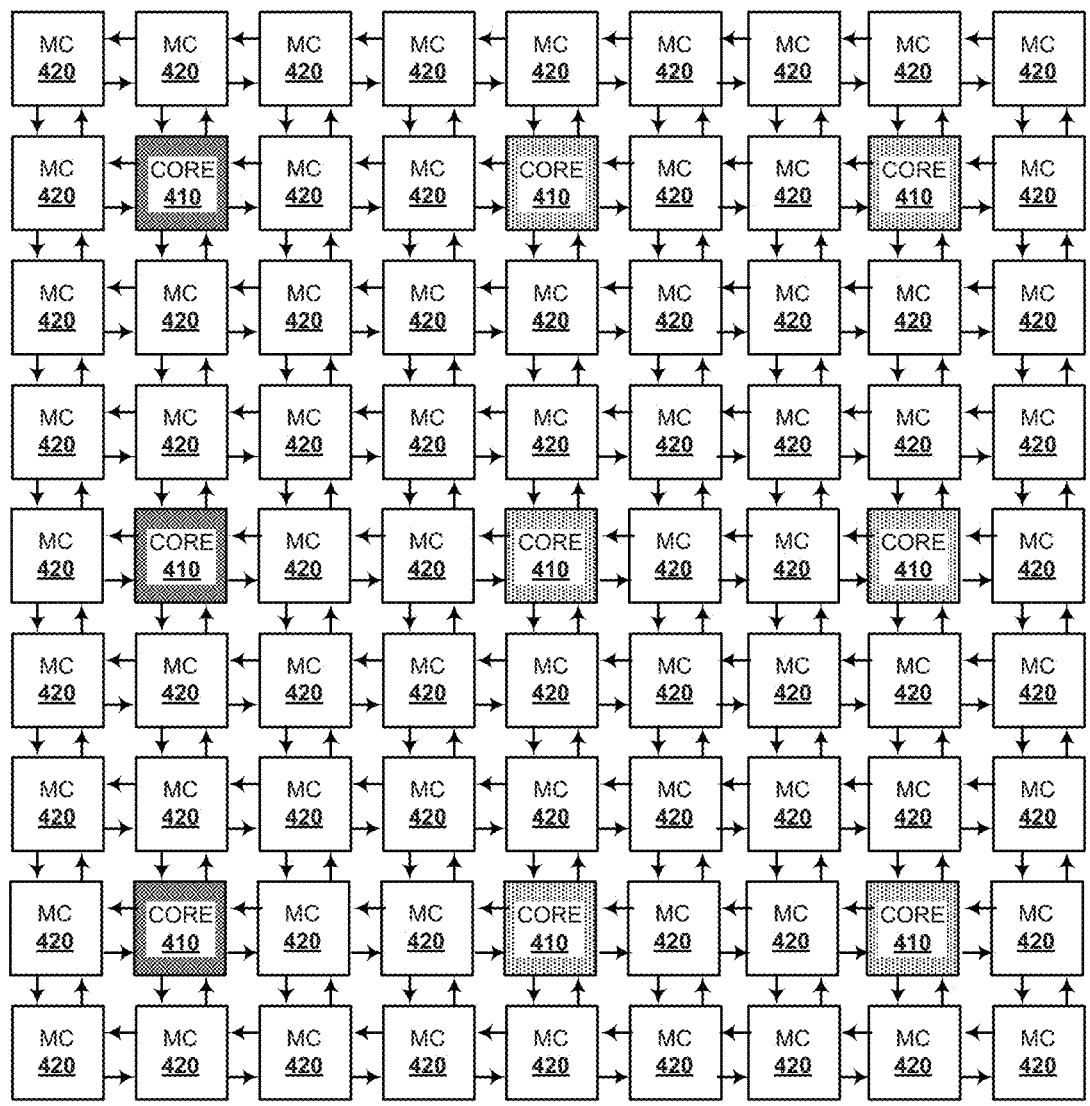
FIG. 8 depicts an example 2D arrangement of process core and memory controller devices for a monolithic IC computing architecture in additional aspects.

FIG. 8 depicts an alternative 2D arrangement 800 of process cores and memory controllers for disclosed NoC computing architectures, in still other embodiments. 2D arrangement 800 includes 8 memory controllers 420 per processor core 410, increasing memory parallelism over and above that provided by 2D arrangement 700. Similar to FIG. 7, the arrangement of memory controllers 420 and processor cores 410 for 2D arrangement 800 can be conceptual or can reflect a physical arrangement of memory circuits and logic circuits on a substrate.

In some embodiments, a processor tile of a computing architecture (e.g., computing architecture 100 of FIG. 1, supra) can have a single core, network router and memory controller per processor tile 120. This simplicity can be attractive to minimize design overhead, but is inflexible since all hardware resources scale at the same rate with the number of processor tiles. Some alternative embodiments form heterogeneous tiles instead. In these embodiments, in addition to having independent processor tiles, independent memory controller tiles can be implemented that integrate a memory controller with a router device (e.g., in conjunction with computing architecture 400 or NoC architecture 500, in at least some embodiments). In these embodiments, the number of memory controllers (and routers) can be decoupled from the number of processor cores, as provided by the 2D arrangements 700, 800 of FIGS. 7 and 8. Heterogeneous tiles enable independent design for the size of each core and the number of access points into the resistive memory sub-arrays.

Figure 9:
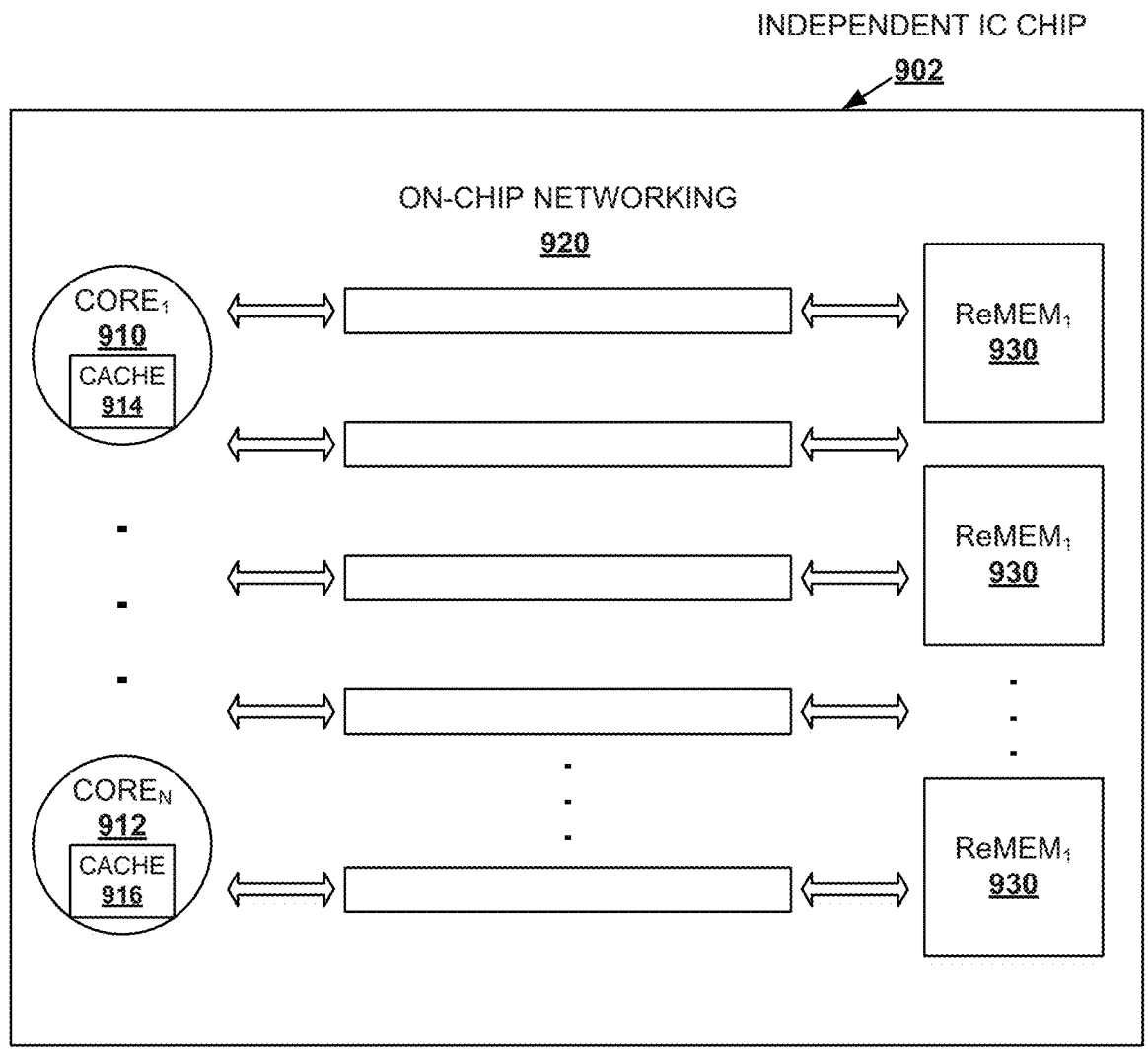
FIG. 9 depicts a block diagram of an example parallel memory access architecture enabling massive memory parallelism for a disclosed IC chip, in further aspects.

FIG. 9 depicts a block diagram of an example NoC monolithic computing system 900 according to one or more embodiments of the present disclosure. Depicted is a single independent IC chip 902 having multiple process cores 910-912, each with access to cache and a cache controller 914-916, respectively. Upon a cache miss, a request to main memory by way of an on-chip networking architecture 920 is issued. The request can be for a full cache block, in some embodiments, portions of a cache block in other embodiments (e.g., a minimum fetch size, such as 8 bytes or other suitable minimum fetch size), or multiple cache blocks. Memory controller associated with resistive main memory 930 can return data associated with the memory requests.

In one or more embodiments, NoC monolithic computing system 900 can comprise 64 process cores 910-912, with 8K independent banks of resistive main memory 930 in each of two stacked 2D crossbar arrays, for a total memory parallelism of 16K memory requests. With access latency of about 700 ns to the resistive main memory 930, and 8-byte minimum fetch size (e.g., 1 byte minimum sub-array fetch, and $L_{act}$=8), computing system 900 is estimated to achieve 23.4 GTEPS. This high performance, coupled with non-volatility of system memory, high capacity system memory (e.g., 64 GB) and elimination of off-chip memory access is expected to present a substantial improvement over the state of the art processing systems.

Figure 10:
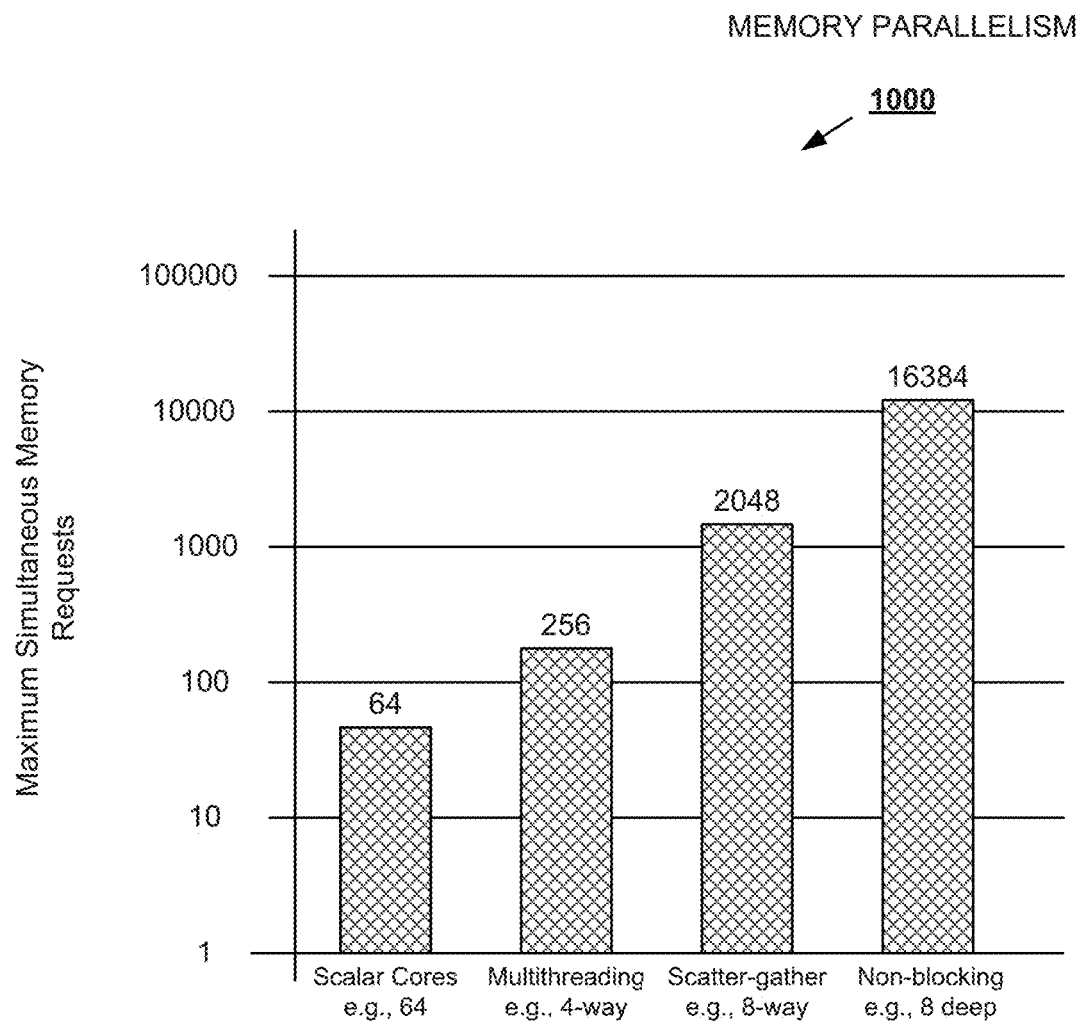
FIG. 10 depicts a chart of memory parallelism for an example 64-processor architecture with embedded resistive memory for differing parallel instruction modalities.

FIG. 10 illustrates a graph 1000 of memory parallelism for an example embedded resistive memory computing architecture according to one or more embodiments presented herein. Graph 1000 charts different instruction sets for achieving parallelism in a multicore system along the horizontal axis, and a number of maximum simultaneous memory requests along the vertical axis, for a 64 core computing system.

Basic parallelism is demonstrated by the independence of multiple cores, in which each core issues a single memory request separate from other cores. For a system with a number: C of cores/processor tiles, each of which can issue up to a single memory request per clock cycle, C concurrent memory requests can be issued and executed simultaneously by such a system (sometimes referred to in the art as a scalar system). For a 64-core scalar system, 64 concurrent memory requests are possible. The next step up is a paradigm in which separate process threads can execute on different cores independently and concurrently (superscalar), or cores configured to switch between hardware contexts to issue multiple memory requests in an interleaved fashion across threads (multi-threading). This results in a multiplier, n, of process threads/interleaved requested executed by C cores that achieves a maximum of n*C concurrent memory requests. Where n=4 in the 64-core system, the number of simultaneous memory requests increases to 256.

As a further improvement, multiple data instruction sets that can process multiple data elements concurrently (e.g., single instruction multiple data (SIMD)) can be implemented to further boost memory parallelism. SIMD pipelines, for example, support scatter-gather, allowing each sub-word from a single scatter-gather operation to generate separate memory requests to distinct physical memory locations. For y-way scatter gather, memory parallelism can increase to y*n*C concurrent memory requests. Depicted in FIG. 10 is an 8-way scatter-gather paradigm in conjunction with 4-way multi-threading and the 64-core system, achieving 2048 concurrent memory requests. This level of memory parallelism far exceeds that of conventional DRAM systems, yet the larger number of resistive memory sub-arrays per chip (e.g., ~64K) and small values of $L_{act}$, 8 for example, permit even larger memory parallelism than this (e.g., 8 thousand simultaneous requests). In embodiments with smaller values of Lau, such as 4, even greater memory parallelism is physically possible (e.g., 16 thousand simultaneous requests).

To further increase memory parallelism, some embodiments of the present disclosure implement non-blocking SIMD scatter-gather. With blocking instructions, when a core issues a long-latency memory operation (e.g., in response to a cache miss that results in a main memory request), the core stalls while waiting for results of the memory operation to be returned. Non-blocking memory operations, on the other hand, are those in which the core can continue executing while the long-latency memory operation is still pending. Write operations, as one example, can be made non-blocking in conjunction with a data buffer configured to stage the stored data before it is written to memory. In various embodiments, per-register presence bits are provided in a register file to identify instructions dependent on a non-blocking load and organize consecutive non-blocking instructions to delay a core stall that occurs in response to a dependent instruction. As an alternative, a scoreboard structure can be organized in memory that identifies and organizes non-blocking instructions consecutively. Both non-blocking loads and stores permit a single thread to issue multiple memory requests if multiple non-blocking memory operations are encountered back-to-back. The amount of memory parallelism generated is thus limited by the number of outstanding non-blocking operations allowed.

Embodiments of the subject disclosure combine non-blocking instruction techniques with SIMD scatter-gather operations to further enhance memory parallelism. For instance, buffering of write operations and tracking of dependent read operations can be applied to a SIMD pipeline and register file to integrate with scatter-gather operations. In an embodiment, z-deep non-blocking instructions can be organized in sequence for the y-way SIMD scatter-gather paradigm, in n-way multi-threading systems. This results in total memory parallelism of: $z*y*n*C$. With $z=4$ in the above 8-way scatter gather, 4-way multi-threading 64-core example, memory parallelism increases to 8K. In FIG. 10, 8-deep nonblocking instruction set is provided, for $z=8$, resulting in 16K memory parallelism.

Figure 11:
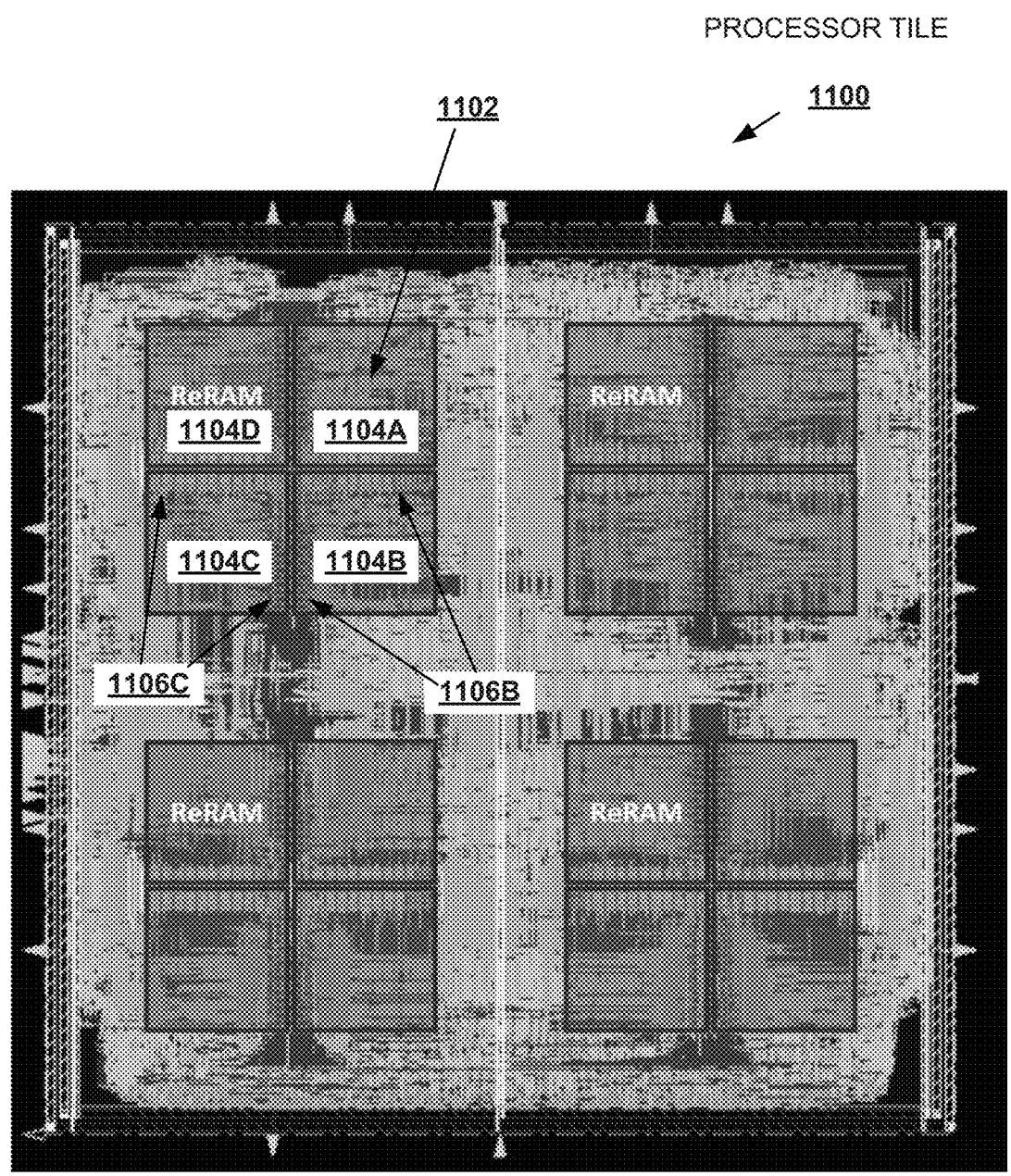
FIG. 11 illustrates a process tile having multiple embedded resistive memory clusters monolithically integrated with a processor core, in at least one embodiment.

FIG. 11 illustrates an example processor tile 1100 according to one or more embodiments of the present disclosure, demonstrating monolithic integration of a CPU with resistive main memory. Processor tile 1100 can be substituted for processor tile 120 of FIG. 1, in one or more embodiments. Processor tile 1100 illustrates location of resistive memory sub-arrays 1104A, 1104B, 1104C, 1104D (referred to collectively as ReRAM sub-arrays 1104A-D) for a single cross-shaped ReRAM cluster 1102, relative to surrounding circuitry. The resistive memory modeled for resistive memory sub-arrays 1104A-D is resistive random access memory (ReRAM) technology produced by Crossbar, Inc (although various other types of resistive non-volatile memory are envisioned within the scope of this disclosure). Because individual resistive memory sub-arrays are small compared with the size of a processor tile 120, peripheral access circuitry to individual resistive memory sub-arrays will be spread about on a processor tile 1100, impinging on logic circuitry embodying a processor core of the processor tile 1100.

Processor tile 1100 represents an example solution to the circuitry layout for access circuitry to individual sub-arrays, and logic circuitry embodying a processor core. Processor tile 1100 illustrates a physical design in which multiple ReRAM sub-arrays 1104A-D are integrated with a very small CPU core. The layout of processor tile 1100 was performed using open-source NCSU FreePK 45 nm process design kit and the Nangate open source digital library for the 45 nm process node. The layout of processor tile 1100 is exemplary only, however, and not intended to be limiting of the embodiments disclosed herein. The CPU core is a Berkeley VSCALE, which is a single issue, 3-stage in-order pipeline, implementing the 32-bit integer RISC-V processor used for computation logic. A single core is implemented in processor tile 120, but the data path is increased to 256 bits to facilitate larger designs (which may still be quite small compared with commercial high-performance CPU cores). Synopsys Design Compiler is used for the synthesis step of the tool flow and Cadence Encounter is used for the Automatic Place and Route (APR) step of the flow to produce the final GDSII layout.

Processor tile 1100 illustrates integration of the VSCALE processor with ReRAM memory to create a processor-memory tile, as an example of the processor tile 120 provided above. Each ReRAM sub-array 1104A-D comprises peripheral access circuits that form an L-shape located along two perpendicular edges of the sub-array 1104. For example, 1106C illustrates L-shaped peripheral access circuit locations for ReRAM sub-array 1104C, and 1106B illustrates L-shaped peripheral access circuit locations for ReRAM sub-array 1104B. Respective access circuitry is provided at similar locations for ReRAM sub-arrays 1104A and 1104B, as well as for sub-arrays in other cross-shaped ReRAM clusters 1102 of FIG. 11.

The arrangement of peripheral access circuitry 1106B, 1106C, which constitutes a blockage region for the CPU core, is chosen so that the blocks abut each other, resulting in a contiguous blockage region. Note that the peripheral access circuits represent two types of blockage. The first is placement blockage preventing the CPU core's standard cells from being placed in those blockage areas. The second is routing blockage at specific metal layers to limit routing. In FIG. 11, metal layers 1-8 were blocked for routing, enabling the APR tool to route through the blocked regions using metal layers 9 and 10.

The aforementioned diagrams have been described with respect to different components of an integrated circuit chip, a system-on-chip or network-on-chip, including arrangements of memory arrays, memory circuits, logic circuits and system components (e.g., memory controllers, cache controllers, router devices, etc.), and sets of monolithic layers for forming some or all of these components. It should be appreciated that in some suitable alternative aspects of the subject disclosure, individual diagrams can include the depicted arrangement of components/arrays/circuits/devices/layers specified therein, some of the specified components/arrays/circuits/devices/layers, or additional components/arrays/circuits/devices/layers. Sub-components can also be implemented as electrically connected to other sub-components rather than included within a parent component/layer. For example, memory controller 125, router 128 and SIMD instruction set 126 can be embodied on a separate heterogenous tile, rather than integrated as part of processor tile 120. Moreover, components/arrays/circuits/devices, etc., depicted in one drawing should be understood to be operable in other drawings where suitable. For instance, the processor core/memory controller organization depicted in any of FIGS. 4, 5 and 6 could be implemented in the architecture of FIG. 1 as alternative embodiments. Further variations, combinations, subtraction or addition of components not specifically depicted herein but within the understanding of one of skill in the art, or made reasonably known to one of skill in the art by way of the context provided herein is considered within the scope of the present disclosure. Additionally, it is noted that one or more disclosed processes can be combined into a single process providing aggregate functionality. Components of the disclosed architectures can also interact with one or more other components not specifically described herein but known by those of skill in the art.

Figure 12:
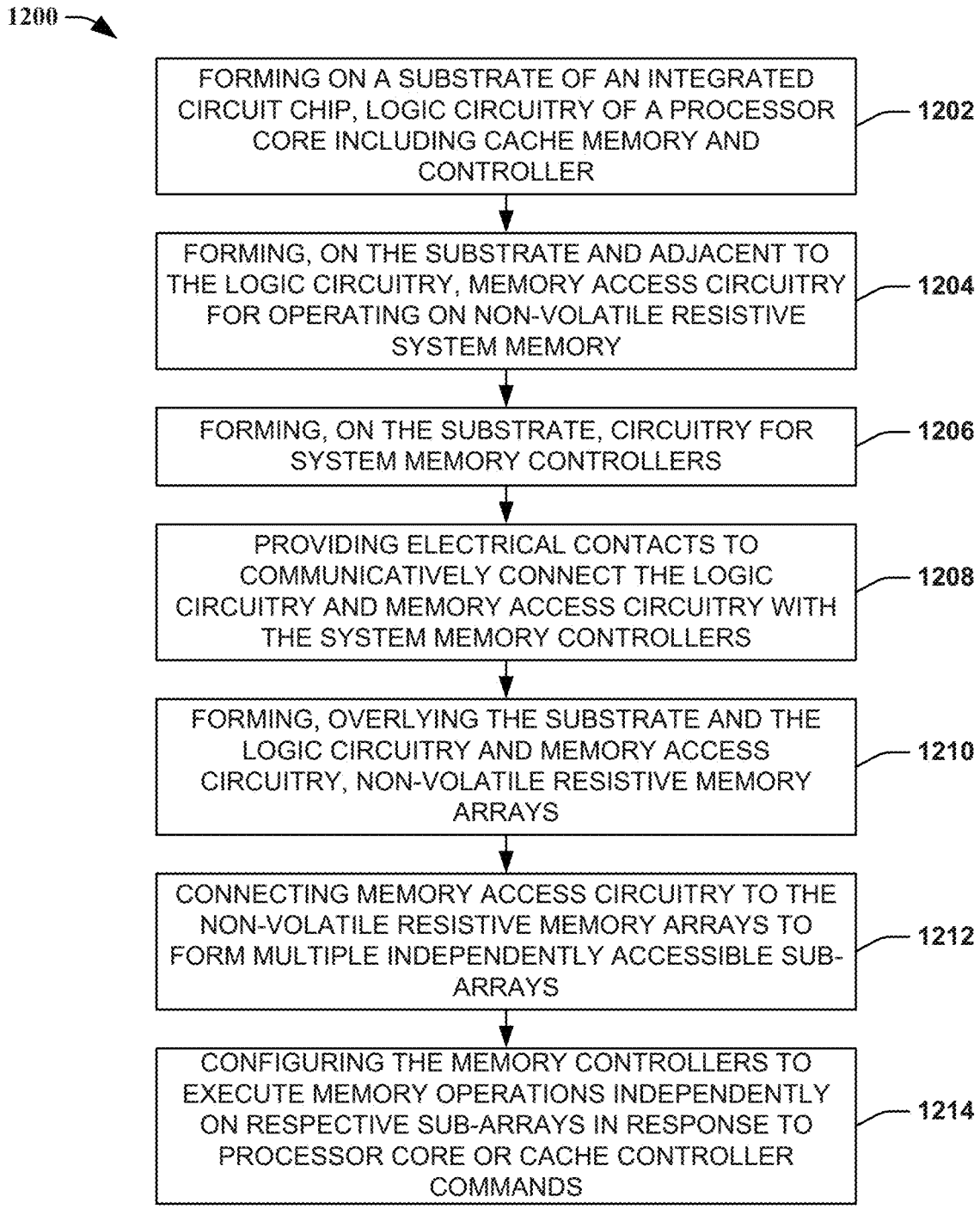
FIG. 12 illustrates a flowchart of a sample method for fabricating a monolithic IC chip with embedded resistive memory and high memory parallelism, in an aspect(s).
Figure 13:
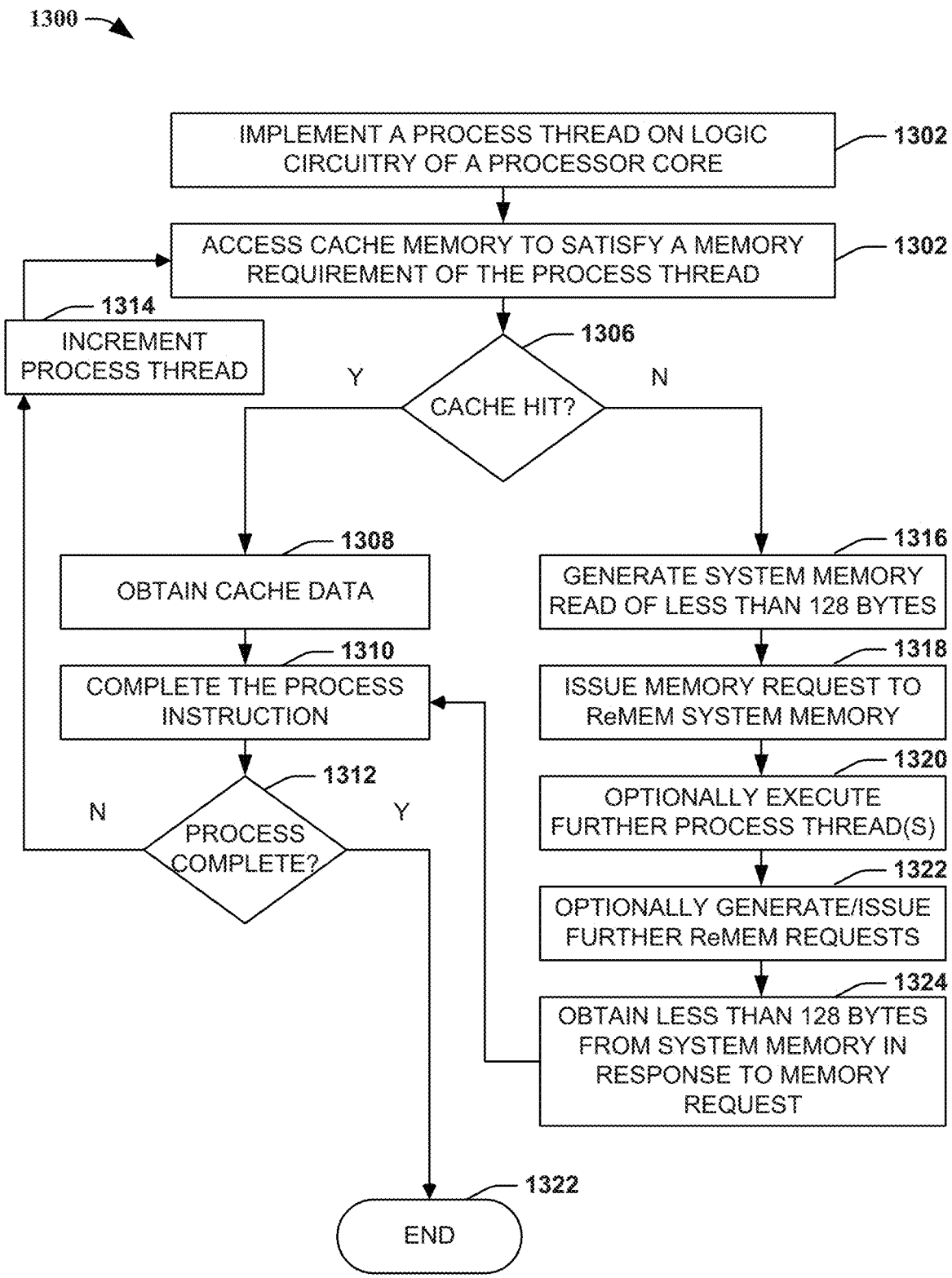
FIG. 13 depicts a flowchart of an example method for implementing main memory requests in conjunction with cache processes for a disclosed IC chip, in an embodiment.
Figure 14:
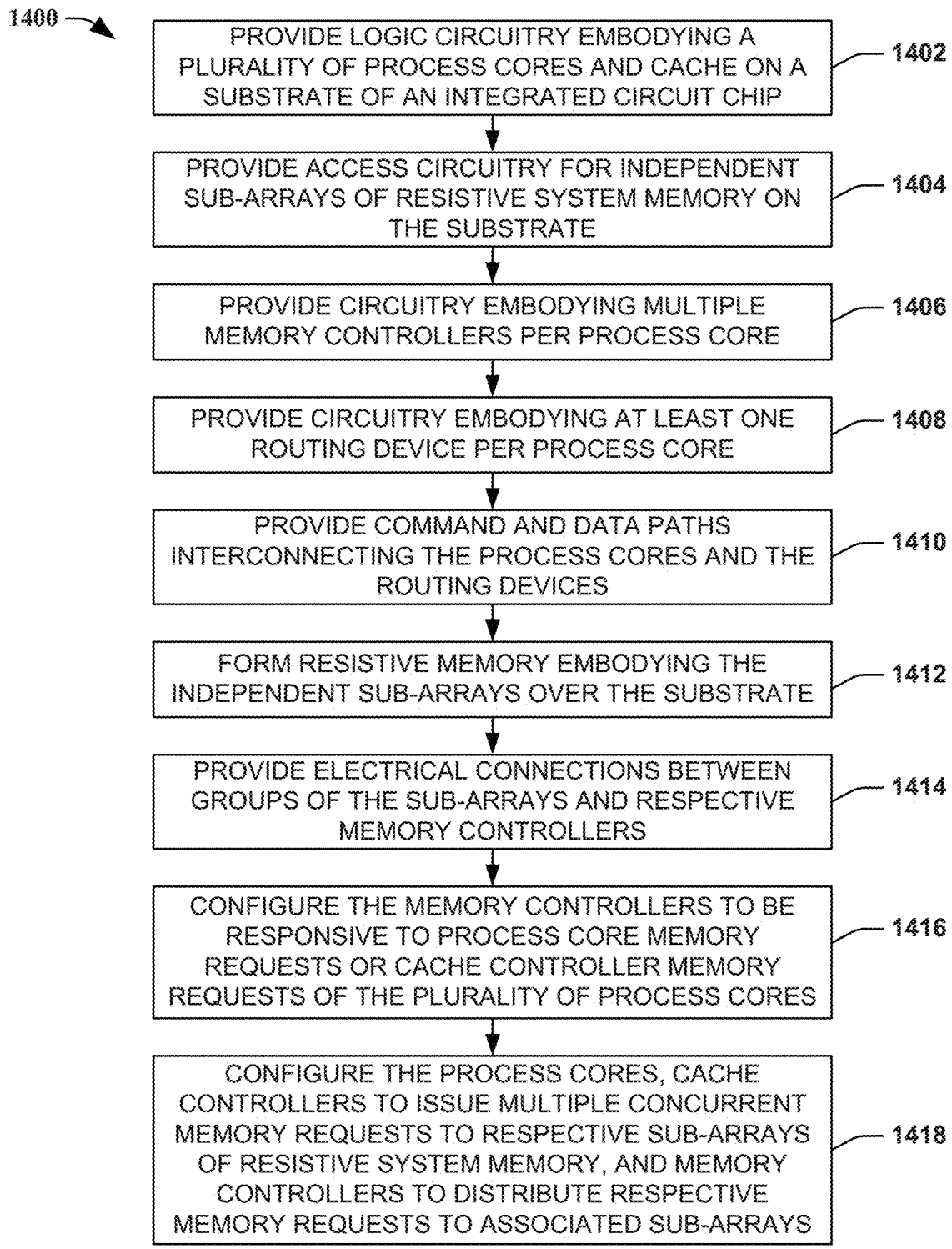
FIG. 14 illustrates a flowchart of a sample method for fabricating a monolithic IC chip with embedded resistive memory according to additional disclosed embodiments.

In view of the exemplary diagrams described supra, process methods that can be implemented in accordance with the disclosed subject matter will be better appreciated with reference to the flow charts of FIGS. 12-14. While for purposes of simplicity of explanation, the methods of FIGS. 12-14 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods disclosed herein. Additionally, it should be further appreciated that some or all of the methods disclosed throughout this specification are capable of being stored on an article of manufacture to facilitate transporting and transferring such methods to an electronic device. The term article of manufacture, as used, is intended to encompass a computer program accessible from any computer-readable device, device in conjunction with a carrier, or storage medium.

Referring now to FIG. 12, there is depicted a method for fabricating a monolithic IC chip comprising resistive system memory, in one or more embodiments. At 1202, method 1200 can comprise forming on a substrate of an integrated circuit chip, logic circuitry of a processor core including cache memory and cache controller circuitry. Logic circuitry can be formed in contiguous regions of the substrate, underlying back-end-of-line metal layers of a wafer layout design, in some embodiments. However, non-contiguous layout of at least portions of the logic circuitry within non-contiguous portions of the substrate is envisioned in other embodiments.

At 1204, method 1200 can comprise forming, at least in part on the substrate and adjacent to the logic circuitry, memory access circuitry for operating on non-volatile resistive system memory. The memory access circuitry can include sense amps, address decoders, multiplexers for coupling power to subsets of memory sub-arrays, and the like. At 1206, method 1200 can additionally comprise forming, at least in part on the substrate, circuitry for system memory controllers.

At 1208, method 1200 can comprise providing electrical contacts to communicatively connect the logic circuitry and memory access circuitry with the system memory controllers. At 1210, method 1200 can comprise forming, overlying the substrate and the logic circuitry and memory access circuitry, non-volatile resistive memory arrays. The resistive memory arrays can be formed in a crossbar pattern between conductive lines of the monolithic IC chip. Moreover, the resistive memory arrays can be formed utilizing CMOS logic processes. In an embodiment, multiple crossbar arrays are formed, stacked at least in part over each other to form a 3D memory array. The 3D memory array is overlying the substrate and logic circuitry, and at least in part overlying the memory access circuitry.

At 1212, method 1200 can comprise connecting memory access circuitry to the non-volatile resistive memory arrays to form multiple independently accessible sub-arrays. A size of each sub-array can include about 2 thousand (2K) by about 2K memory cells, in an embodiment. In at least one embodiment, a total number of independently accessible sub-arrays can be about 64K sub-arrays. Further still, the sub-arrays can be arranged in tiles, and connected to one processor core per tile (or a plurality of processor cores per tile, in other embodiments). In an embodiment, 1024 sub-arrays are provided per processor tile. In further embodiments, 512 sub-arrays are provided per processor tile. In still other embodiments, 128 sub-arrays are provided per processor tile. In yet another embodiment, 64 sub-arrays are provided per processor tile.

In alternative embodiments, the independently accessible sub-arrays can be connected to memory controller and routing tiles, independently of processor tiles. Similar numbers of sub-arrays per memory/router tile can be provided as given above, in these embodiments.

At 1214, method 1200 can comprise configuring the memory controllers to execute memory operations independently on respective sub-arrays in response to processor core or cache controller commands. The memory controllers can be segmented into individual memory bank controllers that respectively access a number, $L_{act}$ of sub-arrays per memory access. The number $L_{act}$ of sub-arrays activated by a bank controller corresponds to a single memory bank, and serves as a minimum fetch size for a memory request of the monolithic IC chip.

Referring to FIG. 13, there is depicted a flowchart of a sample method for operating a processor in a multicore chip comprising resistive system memory, in an embodiment(s). At 1302, method 1300 can comprise implementing a process thread on logic circuitry of a processor core of the multicore chip. At 1304, method 1300 can access cache memory to satisfy a memory requirement of the process thread. At 1306, a determination is made as to whether the cache access results in a cache hit. If a cache hit occurs, method 1300 can proceed to 1308. Otherwise, method 1300 proceeds to 1316.

At 1308, method 1300 can comprise obtaining required data from cache, and at 1310, completing the process instruction requiring the cache data is performed. At 1312, a determination is made as to whether the process thread is complete. If the process thread is complete, method 1300 can proceed to reference number 1322, and end. Otherwise, method 1322 proceeds to reference number 1314, increments the instruction set of the process thread, and returns to reference number 1302.

At 1316, method 1300 generates a system memory access request (e.g., a read) having less than 128-bytes of data. The multicore chip facilitates fetch sizes smaller than a standard DRAM page, which is 128-bytes. Accordingly, the access request can be a single cache block (e.g., 64-bytes), half a cache block (e.g. 32 bytes), or even smaller numbers of data: e.g., 16 bytes, 8 bytes, 4 bytes, 1 byte, etc.

At 1318, method 1300 can comprise issuing the memory request to resistive memory system memory on-chip. At 1320, method 1300 can optionally comprise executing additional process threads while the memory request(s) is pending. At 1322, the additional process threads can also optionally comprise generating and issuing one or more additional resistive memory access requests. The additional memory access requests can include multi-threading requests (issued as part of a separate hardware context, or a separate process thread), a separate memory address of a scatter-gather memory instruction, or a subsequent non-blocking memory access instruction, in various embodiments. At 1324, method 1300 can comprise obtaining less than 128 bytes from system memory in response to the memory request of reference number 1318. From 1424, method 1300 can proceed to 1310 and complete the process instruction for which the cache miss was determined at reference number 1306. Variations of method 1300, known in the art or made known to one of ordinary skill in the art by way of the context provided herein, is considered within the scope of the present disclosure.

Referring now to FIG. 14, a flowchart of an example method 1400 for fabricating a monolithic IC chip according to alternative or additional embodiments is provided. At 1402, method 1400 can comprise providing logic circuitry embodying a plurality of process cores and cache memory/controllers on a substrate of an integrated circuit. The logic circuitry can be provided utilizing CMOS process techniques. At 1404, method 1400 can comprise providing access circuitry for independent sub-arrays of resistive system memory on the substrate. The access circuitry can be adjacent to the logic circuitry, and located proximate associated back-end memory sub-arrays according to a semiconductor design layout in some embodiments. In other embodiments, the access circuitry can be integrated among logic circuitry in a fine-grain mesh implementation. In other embodiments, a combination of the foregoing can be implemented.

At 1406, method 1400 can comprise providing circuitry embodying multiple memory controllers per process core, and at 1408, method 1400 can comprise providing circuitry embodying at least one routing device per process core. In at least one embodiment, the memory controllers per process core and routing device can be organized into a controller tile, independent of a processor tile, as described herein.

At 1410, method 1400 can comprise providing command and data paths interconnecting the process cores and the routing devices. At 1412, method 1400 can comprise forming resistive memory structures embodying the independent sub-arrays of resistive memory, overlying the substrate. The resistive memory structures can be formed utilizing CMOS processes, in an embodiment (e.g., back-end-of-line processes). At 1414, method 1400 can provide electrical connections between groups of the sub-arrays and respective memory controllers. In an embodiment, memory sub-systems are connected to individual controller tiles, which are interconnected to other controller tiles and to processor tiles by the command and data paths. In such embodiments, memory controller tiles serve as endpoints in a NoC architecture, and the processor tiles can operate as clients of the memory controller tiles.

Additionally, at 1416, method 1400 can comprise configuring the memory controllers to be responsive to process core memory requests or cache controller memory requests of the plurality of process cores. Further, at 1418, method 1400 can comprise configuring the process cores, cache controllers to issue multiple concurrent memory requests to respective sub-arrays of resistive system memory, according to a multi-data instruction toolset. Examples of the multi-data instruction toolset can include a multi-threading instruction set, a scatter-gather SIMD multi-threading instruction toolset, or a non-blocking scatter-gather SIMD multi-threading instruction toolset. In various embodiments, the memory controllers are configured to distribute concurrent memory request from multiple process cores or cache controllers to individual memory banks to concurrently execute the multiple memory requests.

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as components of a portable memory device.

Figure 15:
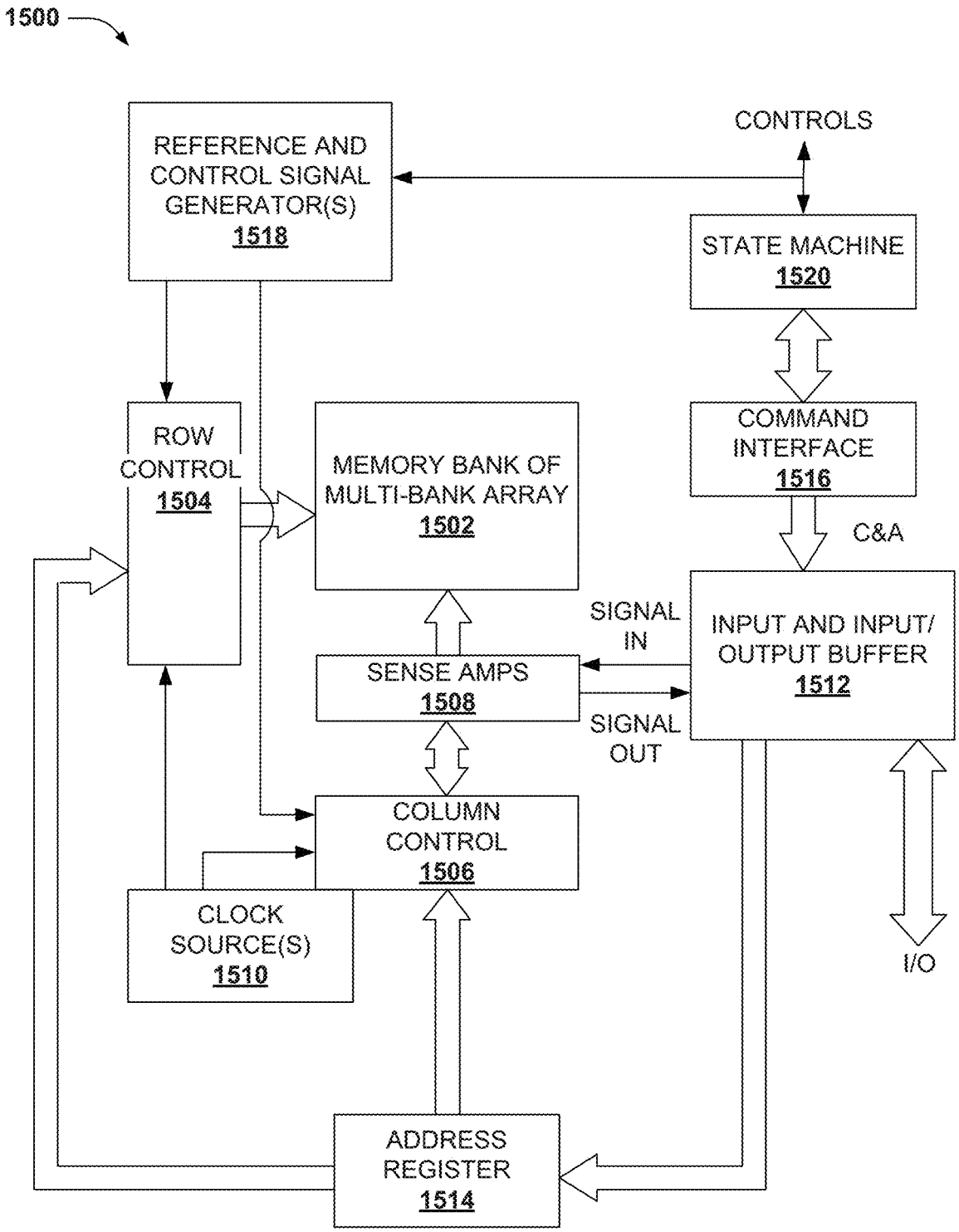
FIG. 15 illustrates a block diagram of a sample electronic operating environment in accordance with certain embodiments of this disclosure.

FIG. 15 illustrates a block diagram of an example operating and control environment 1500 for a memory array 1502 of a memory cell array according to aspects of the subject disclosure. In at least one aspect of the subject disclosure, memory array 1502 can comprise memory selected from a variety of memory cell technologies. In at least one embodiment, memory array 1502 can comprise a two-terminal memory technology, arranged in a compact two or three dimensional architecture. Example architectures can include a 1T1R memory array, and a 1TnR memory array (or 1TNR memory array), as disclosed herein. Suitable two-terminal memory technologies can include resistive-switching memory, conductive-bridging memory, phase-change memory, organic memory, magneto-resistive memory, or the like, or a suitable combination of the foregoing. In some embodiments, memory array 1502 can be a memory bank comprising multiple independently accessible memory sub-arrays. In additional embodiments, memory array 1502 can serve as embedded main memory for a multi-core IC chip, as described herein.

A column controller 1506 and sense amps 1508 can be formed adjacent to memory array 1502. Moreover, column controller 1506 can be configured to activate (or identify for activation) a subset of bit lines of memory array 1502. Column controller 1506 can utilize a control signal provided by a reference and control signal generator(s) 1518 to activate, as well as operate upon, respective ones of the subset of bitlines, applying suitable program, erase or read voltages to those bitlines. Non-activated bitlines can be kept at an inhibit voltage (also applied by reference and control signal generator(s) 1518), to mitigate or avoid bit-disturb effects on these non-activated bitlines.

In addition, operating and control environment 1500 can comprise a row controller 1504. Row controller 1504 can be formed adjacent to and electrically connected with word lines of memory array 1502. Also utilizing control signals of reference and control signal generator(s) 1518, row controller 1504 can select particular rows of memory cells with a suitable selection voltage. Moreover, row controller 1504 can facilitate program, erase or read operations by applying suitable voltages at selected word lines.

Sense amps 1508 can read data from, or write data to the activated memory cells of memory array 1502, which are selected by column control 1506 and row control 1504. Data read out from memory array 1502 can be provided to a buffer 1512. Likewise, data to be written to memory array 1502 can be received from the buffer 1512 and written to the activated memory cells of memory array 1502.

A clock source(s) 1508 can provide respective clock pulses to facilitate timing for read, write, and program operations of row controller 1504 and column controller 1506. Clock source(s) 1508 can further facilitate selection of word lines or bit lines in response to external or internal commands received by operating and control environment 1500. Buffer 1512 can comprise a command and address input, as well as a bidirectional data input and output. Instructions are provided over the command and address input, and the data to be written to memory array 1502 as well as data read from memory array 1502 is conveyed on the bidirectional data input and output, facilitating connection to a process core or cache controller, such as a process core 122 or cache controller 124 of FIG. 1, supra.

Buffer 1512 can be configured to receive write data, receive an erase instruction, receive a status or maintenance instruction, output readout data, output status information, and receive address data and command data, as well as address data for respective instructions. Address data can be transferred to row controller 1504 and column controller 1506 by an address register 1510. In addition, input data is transmitted to memory array 1502 via signal input lines between sense amps 1508 and input/output buffer 1512, and output data is received from memory array 1502 via signal output lines from sense amps 1508 to buffer 1512. Input data can be received from process core or cache controller, and output data can be delivered to the process core/cache controller via memory access circuitry.

Commands received from a process core or a cache controller can be provided to a command interface 1516. Command interface 1516 can be configured to receive internal control signals from the process core/cache controller, and determine whether data input to the input/output buffer 1512 is write data, a command, or an address. Where applicable, input commands can be transferred to an optional state machine 1520.

Optional state machine 1520 can be configured to manage programming and reprogramming of memory array 1502 (as well as other memory banks of a multi-bank memory array). Instructions provided to state machine 1520 are implemented according to control logic configurations, enabling state machine to manage read, write, erase, data input, data output, and other functionality associated with memory cell array 1502. In some aspects, state machine 1520 can send and receive acknowledgments and negative acknowledgments regarding successful receipt or execution of various commands. In further embodiments, state machine 1520 can decode and implement status-related commands, decode and implement configuration commands, and so on.

To implement read, write, erase, input, output, etc., functionality, state machine 1520 can control clock source(s) 1508 or reference and control signal generator(s) 1518. Control of clock source(s) 1508 can cause output pulses configured to facilitate row controller 1504 and column controller 1506 implementing the particular functionality. Output pulses can be transferred to selected bit lines by column controller 1506, for instance, or word lines by row controller 1504, for instance. In some embodiments, state machine 1520 can be replaced by a memory controller as described herein, which serves to implement memory operations on memory array 1502. In alternative embodiments, state machine 1520 can serve as a memory controller and be configured to implement functions of a memory controller disclosed herein.

The illustrated aspects of the disclosure may also be practiced in distributed computing environments where certain tasks are performed by multiple monolithic IC chips containing embedded resistive memory, that are linked through a communications network. In a distributed computing environment, program modules or stored information, instructions, or the like can be located in local or remote memory storage devices.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, ... ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips ... ), optical disks (e.g., compact disk (CD), digital versatile disk (DVD) ... ), smart cards, and flash memory devices (e.g., card, stick, key drive ... ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" where used herein means serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. An integrated circuit device embodied on a single die, comprising:
   a plurality of process cores formed on a substrate of the integrated circuit device including a first process core of the plurality of process cores and a second process core of the plurality of process cores;
   a resistive memory array structure serving as system memory for the plurality of process cores formed above the substrate of the integrated circuit device, the resistive memory array structure comprising multiple resistive memory sub-arrays, each resistive memory sub-array comprising non-volatile, two-terminal resistive switching memory cells;
   a cache memory and a cache memory controller operatively coupled to the first process core;
   access circuitry formed at least in part on the substrate of the integrated circuit device that provides independent operational access to respective resistive memory sub-arrays of the multiple resistive memory sub-arrays; and
   a plurality of memory controllers comprising a first group of memory controllers communicatively coupled with the first process core and operable to receive a first memory instruction from the first process core and execute the first memory instruction on a first plurality of the multiple resistive memory sub-arrays in response to the first memory instruction, and a second group of memory controllers communicatively coupled with the second process core and operable to receive a second memory instruction from the second process core and execute the second memory instruction on a second plurality of the multiple resistive memory sub-arrays in response to the second memory instruction, wherein the first memory instruction or the second memory instruction is a memory read that returns less than 128 bytes of data, and wherein:
      the first group of memory controllers receives the first memory instruction in response to a cache miss event at the cache memory, and
      the first group of memory controllers implements a system memory fetch at the first plurality of the multiple resistive memory sub-arrays to serve a data requirement of the first process core associated with executing the first memory instruction.

2. The integrated circuit device of claim 1, wherein the resistive memory array structure at least in part overlies the plurality of process cores, and further wherein the first memory instruction originates from the cache controller in response to the cache miss event.

3. The integrated circuit device of claim 1, further comprising:
   a first router device associated with the first process core and with the first group of memory controllers;
   a second router device associated with the second process core and with the second group of memory controllers; and
   a command and data path interconnecting the first router device and the second router device, wherein at least one of:
   the first router device decodes a memory address included with the first memory instruction that is addressed within the second plurality of the multiple resistive memory sub-arrays, and forwards at least a portion of the first memory instruction associated with the memory address over the command and data path to the second router device for execution by the second group of memory controllers; or
   the second router device decodes a second memory address included with the second memory instruction that is addressed within the first plurality of the multiple resistive memory sub-arrays, and forwards at least a portion of the second memory instruction associated with the second memory address over the command and data path to the first router device for execution by the first group of memory controllers.

4. The integrated circuit device of claim 1, wherein the plurality of memory controllers are configured to concurrently serve a number of main memory requests from the plurality of process cores equal at least to a number of the multiple resistive memory sub-arrays.

5. The integrated circuit device of claim 4, wherein the integrated circuit device is organized on the substrate into a number of compute tiles, wherein a compute tile of the number of compute tiles contains the first process core of the plurality of process cores, contains the first group of memory controllers, and contains access circuitry dedicated to the first plurality of the multiple resistive memory sub-arrays and operably connected with the first group of memory controllers, wherein a number of the first plurality of the multiple resistive memory sub-arrays associated with the compute tile is selected from a group consisting of: about 64, about 128, about 256, about 512 and about 1024.

6. The integrated circuit device of claim 4, wherein the plurality of process cores is selected from a group consisting of: about 16 or more process cores, about 32 or more process cores, about 64 or more process cores; about 128 or more process cores, about 256 or more process cores, about 512 or more process cores and about 1024 or more process cores.

7. The integrated circuit device of claim 4, wherein, in response to each process core of the plurality of process cores issuing a respective outstanding memory instruction, the plurality of memory controllers is configured to serve a number of concurrent memory instructions equal at least to the number of process cores.

8. The integrated circuit device of claim 4, wherein each process core of the plurality of process cores is a multi-threading process core configured to issue a second number: x, of outstanding memory instructions, and the plurality of memory controllers is configured to serve a number of concurrent memory instructions equal to the number of the plurality of process cores multiplied by x.

9. The integrated circuit device of claim 8, wherein each process core of the plurality of process cores includes n-way scatter-gather single input multiple data (SIMD) process instructions, facilitating each process core of the plurality of process cores to issue x*n outstanding memory instructions, wherein the number of concurrent memory instructions that the plurality of memory controllers is configured to serve is equal to the number of the plurality of process cores multiplied by x*n.

10. The integrated circuit device of claim 9, wherein each process core includes non-blocking scatter-gather SIMD process instructions, which aggregate memory instructions into blocking and non-blocking memory instructions including up to z consecutive non-blocking scatter-gather memory instructions, facilitating each process core of the plurality of process cores to issue up to z*x*n outstanding memory instructions, wherein the number of concurrent memory instructions that the plurality of memory controllers is configured to serve is equal to the number of the plurality of process cores multiplied by z*x*n.

11. The integrated circuit device of claim 1, wherein the access circuitry is divided into a number of access circuitry portions equal to a number of the multiple resistive memory sub-arrays, each access circuitry portion facilitating operational access for a single memory controller of the plurality of memory controllers to a single sub-array of the multiple resistive memory sub-arrays.

12. The integrated circuit device of claim 1, wherein the memory read returns a number of bytes of data selected from a group consisting of: 1 byte, 2 bytes, 4 bytes, 8 bytes, 16 bytes, 32 bytes and 64 bytes.

13. The integrated circuit device of claim 1, wherein:
the first group of memory controllers comprises a first memory controller and a second memory controller;
the first memory instruction includes a set of memory addresses located within a first memory bank of the first plurality of the multiple resistive memory sub-arrays that is controlled by the first memory controller, and includes a second set of memory addresses located within a second memory bank of the second plurality of multiple resistive memory sub-arrays that is controlled by the second memory controller;
the first memory controller activates resistive memory sub-arrays associated with the first memory bank in response to the first memory instruction and retrieves data from a data location within at least one of the activated memory sub-arrays defined by the set of memory addresses, wherein the data location comprises an amount of data; and
the second memory controller activates resistive memory sub-arrays associated with the second memory bank in response to the first memory instruction and retrieves data from a second data location within at least one of the activated memory sub-arrays defined by the second set of memory addresses, wherein the second data location comprises a second amount of data, further wherein: the first amount of data or the second amount of data is selected from a group consisting of: 1 byte, 2 bytes, 4 bytes and 8 bytes of data.

14. A method of fabricating an integrated circuit device, comprising:
provide logic circuitry embodying a plurality of process cores and cache memory for the process cores at least in part within a substrate of a chip;
provide access circuitry for independent sub-arrays of resistive system memory at least in part in the substrate of the chip, the access circuitry including an address decoder or a sense amplifier;
provide circuitry embodying multiple memory controllers per process core of the plurality of process cores at least in part on the substrate of the chip;
form non-volatile, two-terminal resistive memory devices embodying the independent sub-arrays of resistive system memory overlying the substrate and overlying at least a portion of the logic circuitry, the access circuitry or the circuitry embodying the multiple memory controllers;
form electrical connections between respective portions of the access circuitry on the substrate of the chip and each independent sub-array of the resistive system memory overlying the substrate of the chip;
form electrical connections between circuitry embodying each memory controller and respective portions of the access circuitry;
provide communication pathways between the logic circuitry embodying the plurality of process cores and the circuitry embodying the multiple memory controllers; and
configuring a memory controller of the multiple memory controllers to implement a memory instruction in first part on an independent sub-array of the resistive system memory associated with the memory controller and configuring the memory controller to request a second memory controller of the multiple memory controllers to implement the memory instruction in second part on a second independent sub-array of the resistive system memory associated with the second memory controller.

15. The method of claim 14, further comprising providing a plurality of router devices within the logic circuitry embodying the plurality of process cores, and providing a command and data path interconnecting the router devices.

16. The method of claim 15, wherein the command and data path is configured to convey a memory command between router devices of the plurality of router devices, and is configured to convey data associated with the memory command between the router devices.

17. The method of claim 14, further comprising configuring the process cores or the cache memory to issue multiple concurrent memory requests to respective memory controllers of the multiple memory controllers according to multi-process instruction set selected from a group consisting of: an n-way multithreading process set, an n*x-way scatter-gather multithreading process set and a z*n*x-way non-blocking scatter-gather multithreading process set, where n, x and z are suitable positive integers.

18. An integrated circuit device embodied on a single die, comprising:
- a plurality of processor tiles, wherein a processor tile of the plurality of processor tiles comprising a process core, cache memory and a cache controller, a memory controller and a multi-data memory instruction set, wherein the plurality of processor tiles are formed on a substrate of the integrated circuit device;
- a resistive memory array structure formed above the substrate of the integrated circuit device and at least in part overlying the plurality of processor tiles, the resistive memory array structure comprising multiple independently addressable sub-arrays formed of non-volatile, two-terminal resistive switching memory, wherein a portion of the independently addressable sub-arrays is managed by the memory controller;
- access circuitry formed at least in part on the substrate of the integrated circuit device that interconnects the memory controller with the portion of the independently addressable sub-arrays managed by the memory controller; and
- a command and data bus interconnecting respective processor tiles of the plurality of processor tiles, wherein the resistive memory array structure serves as system memory for the process core of the processor tile.

19. The integrated circuit device of claim 18, wherein the memory controller is responsive to a memory request issued by the cache controller resulting from a cache miss, retrieves data from the portion of the independently addressable sub-arrays managed by the memory controller in response to the memory request, and submits the data to the cache controller or the processor tile in response to the memory request.

20. The integrated circuit device of claim 19, wherein the memory request defines a data location of size less than 128 bytes.

* * * * *